(12) United States Patent
Watanabe et al.

(10) Patent No.: US 9,734,901 B2
(45) Date of Patent: Aug. 15, 2017

(54) DISPLAY DEVICE WITH SEMICONDUCTOR MEMORY CELL

(75) Inventors: Yasuko Watanabe, Atsugi (JP);
Yasuyuki Arai, Atsugi (JP); Hiroko Abe, Setagaya (JP); Yuji Iwaki, Atsugi (JP); Mikio Yukawa, Atsugi (JP);
Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 2000 days.

(21) Appl. No.: 11/249,767

(22) Filed: Oct. 14, 2005

(65) Prior Publication Data

US 2006/0102919 A1    May 18, 2006

(30) Foreign Application Priority Data

Oct. 29, 2004  (JP) .................. 2004-316439

(51) Int. Cl.
*G09G 3/3225* (2016.01)
*G09G 3/3216* (2016.01)
(Continued)

(52) U.S. Cl.
CPC .......... *G11C 13/0014* (2013.01); *B82Y 10/00* (2013.01); *G09G 3/3216* (2013.01); *G09G 3/3225* (2013.01); *G11C 13/0016* (2013.01); *G09G 3/3648* (2013.01); *G09G 2310/0251* (2013.01)

(58) Field of Classification Search
CPC . G11C 13/0014; G11C 13/0016; B82Y 10/00; G09G 3/3216; G09G 3/3225; G09G 2310/0251; G09G 3/3648

USPC ........ 438/29, 34, 99, 149; 257/1–82, 88, 99; 345/76; 365/174
See application file for complete search history.

(56) References Cited

U.S. PATENT DOCUMENTS 6,416,714 B1 *  7/2002  Nova et al. ................. 435/5
6,528,815 B1 *  3/2003  Brown et al. .............. 257/40
(Continued)

FOREIGN PATENT DOCUMENTS

CN    1407526      4/2003
JP    10-228248    8/1998
(Continued)

OTHER PUBLICATIONS

Office Action (Application No. 200510116092.0) Dated Apr. 10, 2009.

*Primary Examiner* — Kumar Patel
*Assistant Examiner* — Amy C Onyekaba
(74) *Attorney, Agent, or Firm* — Eric J. Robinson; Robinson Intellectual Property Law Office, P.C.

(57) ABSTRACT

The present invention provides a display device including a nonvolatile memory circuit to which data can be added without increasing the number of manufacturing steps, and an electronic appliance using the display device. A display device of the present invention has a memory circuit that includes a memory element with a simple structure in which an organic compound layer is interposed between a pair of conductive layers. According to the present invention having the above mentioned structure, a display device having a nonvolatile memory circuit to which data can be added can be provided without increasing the number of manufacturing steps.

16 Claims, 20 Drawing Sheets

(51) Int. Cl.
 *G11C 13/00* (2006.01)
 *B82Y 10/00* (2011.01)
 *G09G 3/36* (2006.01)

(56) References Cited

U.S. PATENT DOCUMENTS

| | | |
|---|---|---|
| 6,773,954 B1 | 8/2004 | Subramanian et al. |
| 6,777,272 B2 | 8/2004 | Yamazaki et al. |
| 6,870,183 B2 | 3/2005 | Tripsas et al. |
| 6,900,488 B1 | 5/2005 | Lopatin et al. |
| 6,903,958 B2 | 6/2005 | Bernds et al. |
| 6,936,545 B1 | 8/2005 | Xie et al. |
| 6,947,321 B2 | 9/2005 | Tanabe |
| 6,950,331 B2 | 9/2005 | Yang et al. |
| 7,063,994 B2 * | 6/2006 | Xiao et al. .............. 438/29 |
| 7,088,052 B2 | 8/2006 | Kimura |
| 7,230,601 B2 | 6/2007 | Yamazaki et al. |
| 2002/0177007 A1 * | 11/2002 | Chernobrod et al. ......... 257/88 |
| 2002/0187567 A1 * | 12/2002 | Yamazaki et al. ............ 438/29 |
| 2003/0034940 A1 | 2/2003 | Yamazaki et al. |
| 2005/0093045 A1 * | 5/2005 | Tsujioka ..................... 257/296 |
| 2005/0179628 A1 | 8/2005 | Kimura |
| 2006/0017669 A1 * | 1/2006 | Cok et al. ...................... 345/77 |
| 2006/0043885 A1 * | 3/2006 | Poplavskyy et al. ......... 313/506 |

FOREIGN PATENT DOCUMENTS

| | | |
|---|---|---|
| JP | 2000-252373 A | 9/2000 |
| JP | 2002-328617 A | 11/2002 |
| JP | 2004-509458 | 3/2004 |
| JP | 2004-128471 A | 4/2004 |
| WO | WO-97/30445 | 8/1997 |
| WO | WO-2004/015778 | 2/2004 |

* cited by examiner

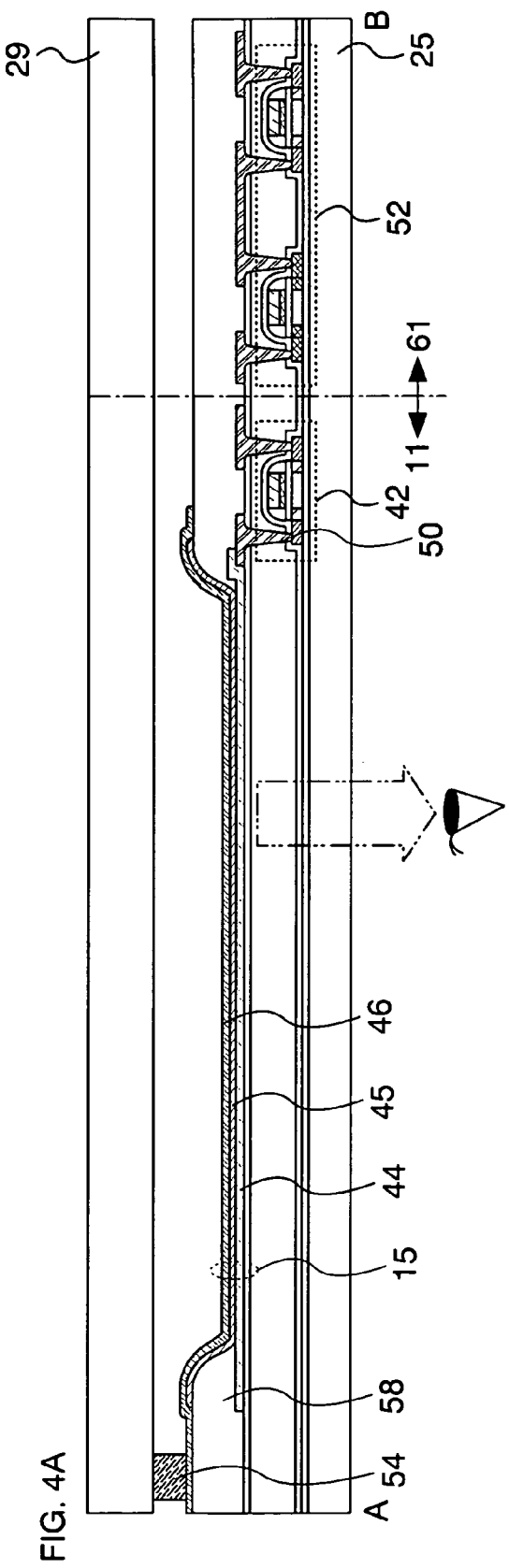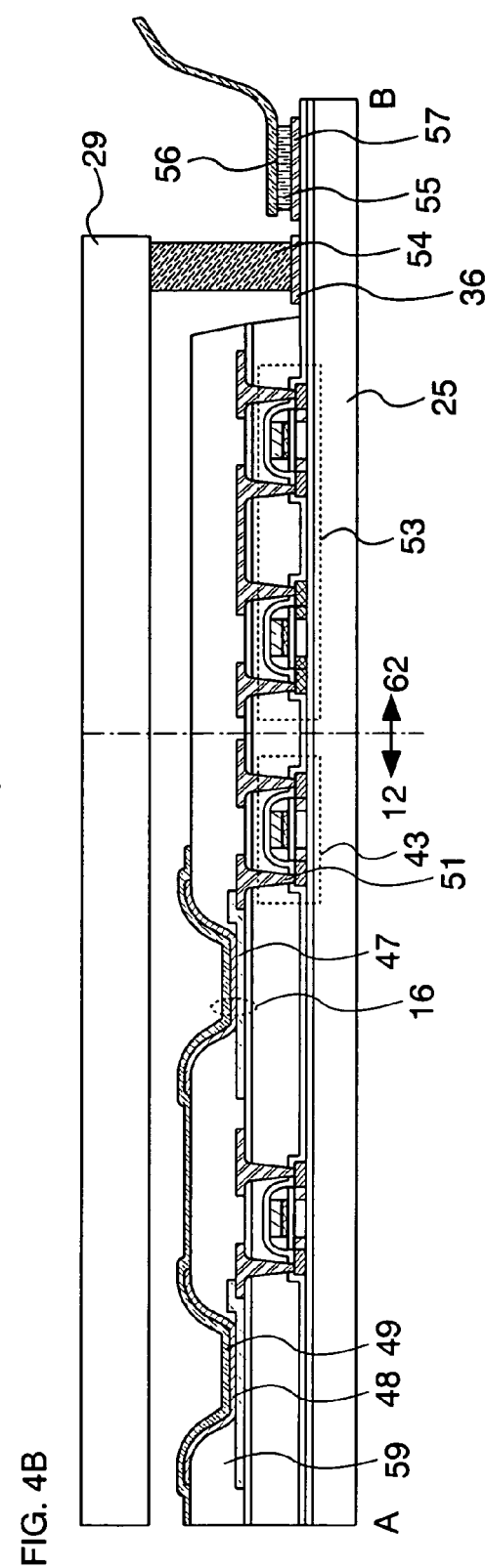

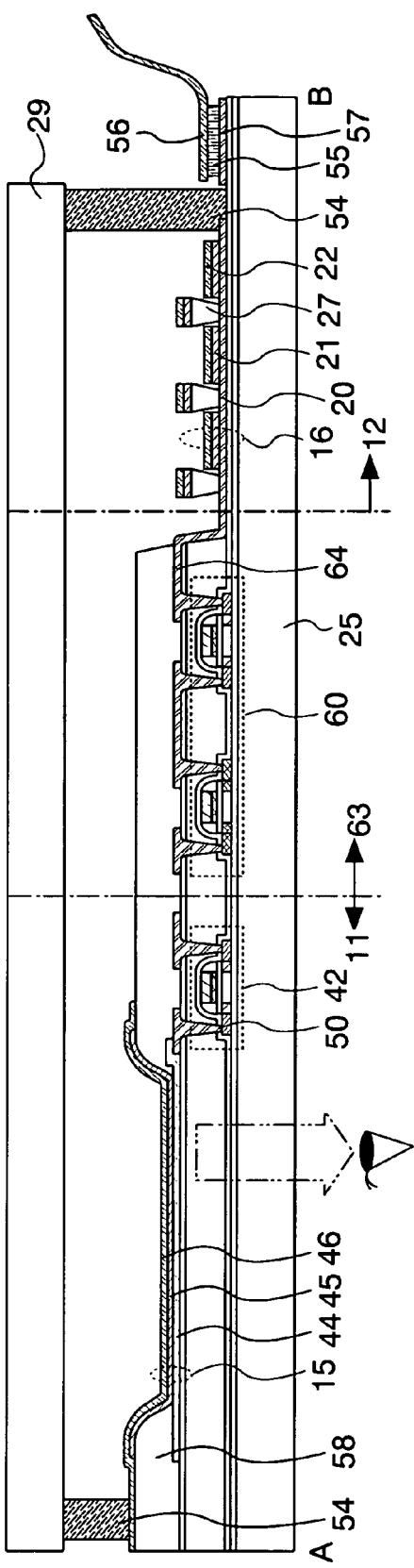
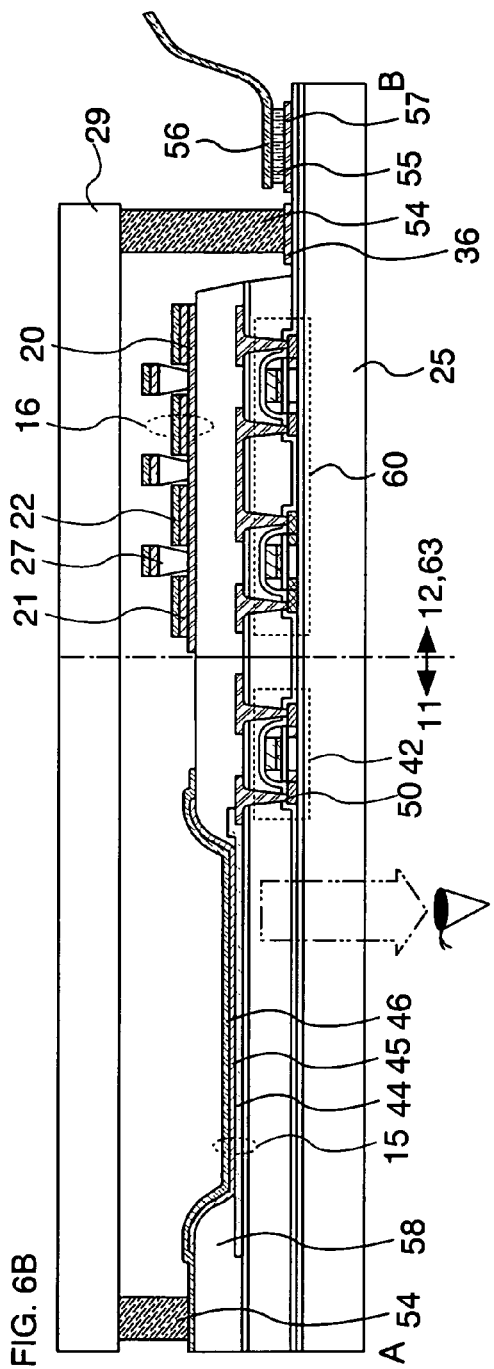
FIG. 6A
FIG. 6B 128  14  12  127

132  129  128  16  127  133 output of the laser light time

9102

9801

9702
9701

9201

9301

9401

○ : before the short-circuiting    □ : after the short-circuiting

○ : before the short-circuiting  □ : after the short-circuiting

○ : before the short-circuiting　　　□ : after the short-circuiting

DISPLAY DEVICE WITH SEMICONDUCTOR MEMORY CELL

BACKGROUND OF THE INVENTION

1. Field of the Invention

The present invention relates to a display device including a plurality of pixels and a plurality of memory cells. The present invention also relates to an electronic appliance using the display device having a plurality of pixels and a plurality of memory cells.

2. Description of the Related Art

In recent years, development of a display device including various kinds of circuits provided over a substrate has been carried out. For example, there is a monolithic display device in which an active matrix circuit for displaying images and a driving circuit for controlling the operation of the active matrix circuit are provided over a same substrate (e.g., see the patent document 1).

[Patent Document 1]: Japanese Patent Application Laid-Open No. Hei 10-228248

When a memory circuit for storing data is provided together with a pixel portion for displaying images and a driving circuit for controlling the operation of the pixel portion over a substrate, a high performance, multifunction and high-value-added display device can be provided. As the memory circuit, a DRAM (dynamic random access memory), an SRAM (static random access memory), an FeRAM (ferroelectric random access memory), a mask ROM (read only memory), an EPROM (electrically programmable read only memory), an EEPROM (electrically erasable read only memory), a flash memory and the like can be given. The DRAM and the SRAM are volatile memories and have a drawback in that when turning the power off, data must be rewritten in the memories. The FeRAM is a nonvolatile memory and has a drawback of increasing the number of manufacturing steps since a capacitor element including a ferroelectric layer is used. The mask ROM includes a simple structure; however, it has a defect in that data must be written during the manufacturing process and new data cannot be written in the mask ROM additionally. The EPROM, the EEPROM and the flash memory are nonvolatile memories; however, since they use elements each including two gate electrodes, they has a drawback of increasing the number of manufacturing steps.

SUMMARY OF THE INVENTION

In view of the above problems, an object of the present invention is to provide a display device having an nonvolatile memory circuit in which data can be additionally written without increasing the number of manufacturing steps, and an electronic appliance using the display device.

The present invention provides a display device having a memory circuit that includes a memory element with a simple structure in which an organic compound layer is interposed between a pair of conductive layers. According to the present invention having the above structure, a display device having a nonvolatile memory circuit in which data can be additionally written without increasing the number of manufacturing steps can be provided.

In an aspect of the invention, a display device has a plurality of pixels for displaying images and a plurality of memory cells for storing data that are provided over a substrate. Each of the plurality of pixels has a light emitting element. Each of the plurality of memory cells has a memory element. Each of the light emitting element and the memory element has a first conductive layer, an organic compound layer being in contact with the first conductive layer, and a second conductive layer being in contact with the organic compound layer.

In another aspect of the presents invention, a display device includes a pixel portion and a memory cell portion that are provided over a substrate. The pixel portion has a plurality of pixels. The memory cell portion has a plurality of memory cells. Each of the plurality of pixels has a light emitting element. Each of the plurality of memory cells has a memory element. The pixel portion and the memory cell portion have a plurality of first wirings extending in a first direction and a plurality of second wirings extending in a second direction perpendicular to the first direction, respectively. Each of the light emitting element and the memory element has a first conductive layer functioning as the first wiring, an organic compound layer being in contact with the first conductive layer, and a second conductive layer being in contact with the organic compound layer and functioning as the second wiring.

In another aspect of the invention, a display device has a pixel portion and a memory cell portion that are provided over a substrate. The pixel portion has a plurality of pixels. The memory cell portion has a plurality of memory cells. Each of the plurality of pixels has a light emitting element and a driving transistor (which corresponds to a first transistor). Each of the plurality of memory cells has a memory element and a switching transistor (which corresponds to a second transistor). Each of the light emitting element and the memory element has a first conductive layer, an organic compound layer being in contact with the first conductive layer and a second conductive layer being in contact with the organic compound layer. The first conductive layer or the second conductive layer included in each light emitting element is connected to a source region or a drain region of the driving transistor. The first conductive layer or the second conductive layer included in each memory element is connected to a source region or a drain region of the switching transistor.

In another aspect of the invention, a display device has a pixel portion and a memory cell portion that are provided over a substrate. The pixel portion has a plurality of pixels. The memory cell portion has a plurality of memory cells. Each of the plurality of pixels has a light emitting element and a driving transistor. Each light emitting element has a pair of conductive layers and an organic compound layer that is interposed between the pair of conductive layers. One of the pair of the conductive layers included in the light emitting element is connected to a source region or a drain region of the driving transistor. The memory cell portion has a plurality of first wirings extending in a first direction and a plurality of second wirings extending in a second direction perpendicular to the first direction. The plurality of memory cells have memory elements, respectively. Each memory element has a first conductive layer functioning as the first wiring, an organic compound layer being in contact with the first conductive layer, and a second conductive layer being in contact with the organic compound layer and functioning as the second wiring.

In another aspect of the invention, a display device has a pixel portion, a memory cell portion, and a driver circuit portion that are provided over a substrate. The pixel portion has a plurality of pixels. The memory cell portion has a plurality of memory cells. The driver circuit portion has a plurality of transistors. The plurality of pixels have light emitting elements and driving transistors, respectively. Each light emitting element has a pair of conductive layers and an organic compound layer that is interposed between the pair of conductive layers. One of the pair of conductive layers included in each light emitting element is connected to a source region or a drain region of the driving transistor. The memory cell portion has a plurality of first wirings extending in a first direction and a plurality of second wirings extending in a second direction perpendicular to the first direction. The plurality of memory cells have memory elements, respectively. Each memory element has a first conductive layer functioning as the first wiring, an organic compound layer being in contact with the first conductive layer, and a second conductive layer being in contact with the organic compound layer and functioning as the second wiring. The memory cell portion is provided to overlap with the driver circuit portion.

In another aspect of the invention, a display device has a pixel portion and a memory cell portion that are provided over a substrate. The pixel portion has a plurality of pixels. The memory cell portion has a plurality of memory cells. The plurality of pixels have liquid crystal elements and transistors, respectively. The memory cell portion has a plurality of first wirings extending in a first direction and a plurality of second wirings extending in a second direction perpendicular to the first direction. The plurality of memory cells have memory elements, respectively. Each memory element has a first conductive layer functioning as the first wiring, an organic compound layer being in contact with the first conductive layer, and a second conductive layer being in contact with the organic compound layer and functioning as the second wiring.

In the display device having the above structure, the memory element is an element of which a conducting property is changed due to an optical effect. Further, the resistance of the memory element is changed due to the optical effect. Also, the resistance of the memory element is changed due to an electric effect. The organic compound layer is formed of a conjugated polymer material doped with a photo acid generator. In addition, the organic compound layer is formed of an electron transporting material or a hole transporting material. Moreover, the present invention provides an electronic appliance using a display device with the above structure.

In the display device having the above structure, the memory element is a element in that a distance between the first conductive layer and the second conductive layer is changed due to an electric effect. This indicates that when writing data in the memory element by utilizing the electric effect, a voltage is applied to the memory element and the first and second conductive layers are sometimes short circuited each other. That is, when a voltage is applied to the memory element and the first and second conductive layers are short circuited each other, the distance between the first and second conductive layers is changed compared to before the first and second conductive layers are short circuited each other.

The organic compound layer includes at least a material with a carrier transporting property. This is because upon wiring data in the memory element by utilizing an electric effect, it is necessary to transport a carrier so as to flow current through the memory element. The organic compound layer also has a material with a carrier transporting property. The electric conductivity of the organic compound layer is $1.0 \times 10^{-3}$ S·cm or less and $1.0 \times 10^{-15}$ S·cm or more.

The thickness of the organic compound layer is 5 to 60 nm, and more preferably, 10 to 20 nm. If the thickness of the organic compound layer is 5 nm or less, the thickness thereof is difficult to be controlled, causing variations in the thickness. Alternatively, if the thickness of the organic compound layer is 60 nm or more, the power consumption that is required for writing data in the memory element by utilizing the electric effect is increased. When the thickness of the organic compound layer is set to be 10 to 20 nm, the variations in the thickness are difficult to be caused, making it possible to suppress the power consumption. Furthermore, the substrate may have a flexible property.

The display device of the present invention may employ a transistor formed using any of an amorphous semiconductor layer, a microcrystalline semiconductor layer, a single crystalline semiconductor layer, an organic semiconductor layer, and the like. The transistor may employ any of a top gate structure in that a semiconductor layer, a gate insulating layer and a gate electrode are sequentially laminated, a bottom gate structure in that a gate electrode, a gate insulating layer and a semiconductor layer are sequentially laminated, and a dual gate structure in that a first gate electrode, a first gate insulating layer, a semiconductor layer, a second gate insulating layer and a second gate electrode are sequentially laminated. Further, either a transistor that includes a source, a drain, a gate electrode and a channel formation region or a transistor that includes a source, a drain, a plurality of gate electrodes, and a plurality of channel formation regions can be employed.

Furthermore, data such as video signals and various kinds of control signals is stored in a memory cell portion included in the display device of the present invention. The data stored in the memory cell portion is arbitrarily supplied to a pixel portion. Images are displayed on the display portion depending on the video signals or the various kinds of signals supplied by the memory cell portion. By forming the pixel portion for displaying the images and the memory cell portion for storing the data over a same substrate, the number of IC chips connected to an external portion can be reduced, making it possible to provide a small, thin and lightweight display device.

Data is written in the memory circuit included in the display device of the present invention by utilizing the optical effect or the electric effect. The memory circuit is nonvolatile so that data can be additionally written in the memory circuit. Therefore, new data can be additionally written in the memory circuit while preventing data from being rewritten illegally and ensuring the security. Accordingly, the present invention can provide a display device that realizes the multifunction, high performance and high added value.

One feature of the invention is that the display device has a memory circuit including a memory element with a structure in which an organic compound layer is interposed between a pair of conductive layers. Since the memory element has a same structure or a similar structure to that of a light emitting element and has a simple structure, the memory element can be manufactured easily without increasing the number of manufacturing steps, making it possible to provide an inexpensive display device. In addition, since an area of a memory cell can be easily reduced, memory cells can be highly integrated easily. Therefore, a display device including a high-capacity memory circuit can be provided.

Also, another feature of the display device of the invention is that a plurality of pixels for displaying images and a memory circuit are provided over a same substrate. According to this feature, the number of IC chips that are connected to an external portion can be reduced, and hence, a small, thin and lightweight display device can be provided. This feature of the invention is effective in a portable terminal that is required to be small, thin and lightweight.

BRIEF DESCRIPTION OF THE DRAWINGS

FIGS. 4A and 4B are cross sectional views showing a display device according to the invention (Embodiment Mode 1);

FIGS. 6A and 6B are cross sectional views showing a display device according to the invention (Embodiment Mode 1);

DESCRIPTION OF THE PREFERRED EMBODIMENTS

Figure 1A:
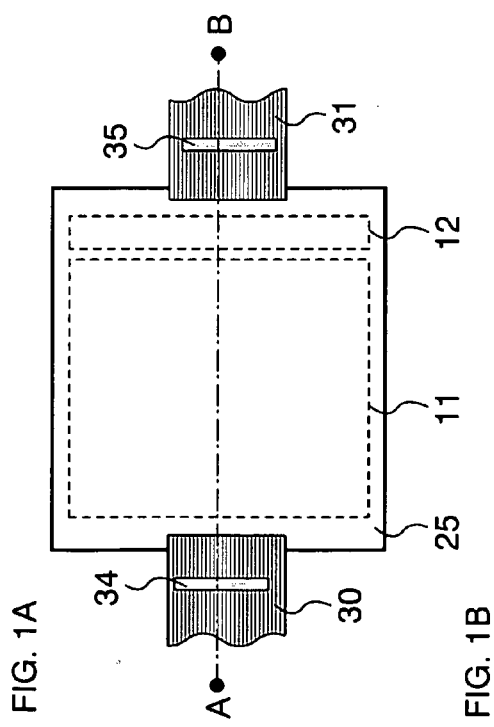
FIGS. 1A to 1C are diagrams showing a display device according to the present invention (Embodiment Mode 1)

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Further, reference numerals indicating same portions are commonly used in the drawings.

[Embodiment Mode 1]

A structure of a display device of the invention will be described with reference to FIGS. 1A to 1C, FIG. 2, FIGS. 3A to 3C, FIGS. 4A and 4B, FIGS. 5A to 5C, FIGS. 6A and 6B, FIGS. 7A to 7C, and FIG. 8. The display device of the invention comprises a pixel portion 11 and a memory cell portion 12. The display device is largely classified into following three cases depending on a structure of the pixel portion 11 and a structure of the memory cell portion 12: a case A where the pixel portion 11 has a passive matrix type and the memory cell portion 12 has a passive matrix type; a case B where the pixel portion 11 has an active matrix type and the memory cell portion 12 has an active matrix type; and a case C where the pixel portion 11 has an active matrix type and the memory cell portion 12 has a passive matrix type. These three cases will be described below.

The case A where the pixel portion 11 has the passive matrix type and the memory cell portion 12 has the passive matrix type will be described with reference to FIGS. 1A to 1C and FIG. 2.

The pixel portion 11 and the memory cell portion 12 are provided over a substrate 25 (see FIG. 1A). The pixel portion 11 has a plurality of pixels 13 and the memory cell portion 12 has a plurality of memory cells 14 (see FIG. 1B). The pixels 13 have light emitting elements 15, respectively while the memory cells 14 have memory elements 16, respectively. The pixel portion 11 includes a plurality of first wirings Sa ($1 \leq a \leq x$, wherein a and x are natural numbers, and they are also referred to as source lines) extending in a first direction and a plurality of second wirings Gb ($1 \leq b \leq y$, wherein b and y are natural numbers, and they are also referred to as gate lines) extending in a second direction perpendicular to the first direction. The memory cell portion 12 includes a plurality of first wirings Ba ($1 \leq a \leq m$, wherein m is a natural number, and they are also referred to as bit lines) extending in the first direction and a plurality of second wirings Wb ($1 \leq b \leq n$, wherein n is a natural number, and they are also referred to as word lines) extending in the second direction perpendicular to the first direction.

Figure 2:
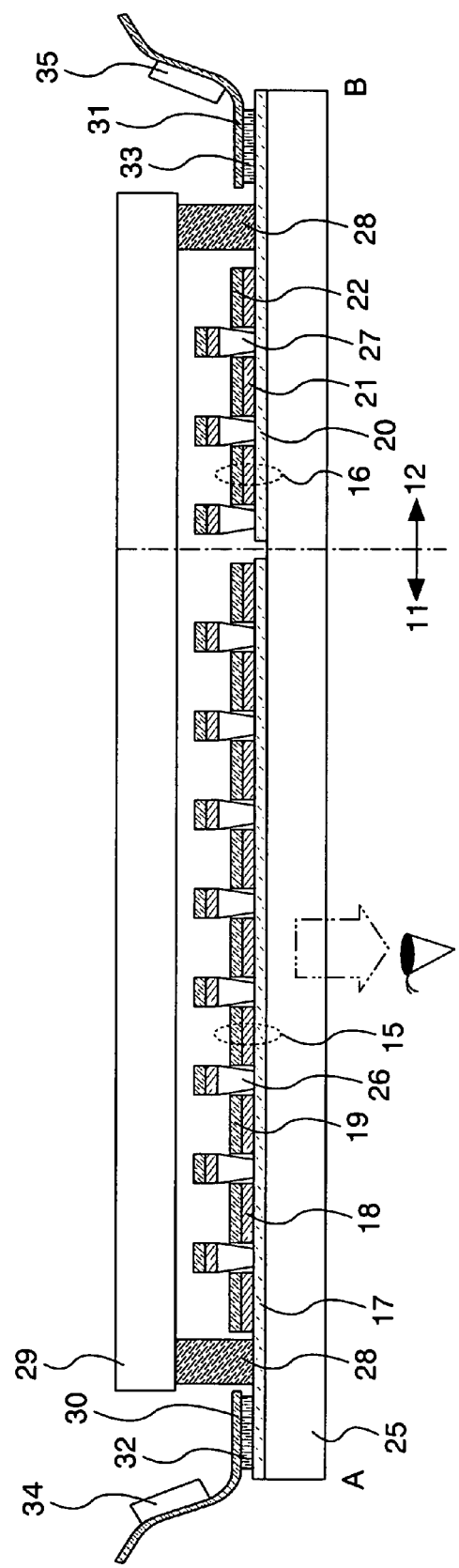
FIG. 2 is a cross sectional view showing a display device according to the invention (Embodiment Mode 1)

Next, a cross sectional structure of the display device having the above structure will be described with reference to FIG. 2. A line A-B of the cross sectional view of FIG. 2 corresponds to a line A-B of a top view of FIG. 1A.

In the pixel portion 11, the light emitting elements 15 are provided. The light emitting elements 15 include a first conductive layer 17 serving as the first wirings Sa, organic compound layers 18, and second conductive layers 19 serving as the second wirings Gb, respectively (see FIG. 2). The first conductive layer 17, the organic compound layer 18 and the second conductive layer 19 are laminated in each light emitting element. Insulating layers 26 that serve as banks are provided between the adjacent light emitting elements 15.

In the memory cell portion 12, the memory elements 16 are provided. The memory elements 16 include a first conductive layer 20 serving as the first wirings Ba, organic compound layers 21, and second conductive layers 22 serving as the second wirings Wb. The first conductive layer 20, the organic compound layer 21 and the second conductive layer 22 are laminated in each memory element. Insulating layers 27 serving as banks are provided between the adjacent memory elements.

A sealing material 28 is provided over a substrate 25. The substrate 25 and a counter substrate 29 are attached to each other with the sealing material 28. Further, a connection film 30 connecting to the first conductive layer 17 through an anisotropic conductive layer 32 and a connection film 31 connecting to the first conductive layer 20 through an anisotropic conductive layer 33 are provided over the substrate 25. Concretely, the connection films 30 and 31 correspond to flexible printed circuits (FPCs) and the like. Signals for controlling the operation of the plural elements that constitute the pixel portion 11 and the memory cell portion 12 and the power potential are input from an external portion through the connection films 30 and 31.

In the above structure, since the pixel portion 11 and the memory cell portion 12 have both the passive matrix type, transistors are not provided over the substrate 25. Therefore, in order to control the pixel portion 11 and the memory cell portion 12, IC chips are used. The IC chips may be, for example, provided as follows. IC chips 34 and 35 serving as driver circuits are attached to the connection films 30 and 31 (see FIG. 1A and FIG. 2). Alternatively, the IC chips 34 and 35 may be provided over the substrate 25. This can reduce the number of IC chips that are connected to the external portion, thereby realizing miniaturization and reduction in thickness of the display device. That is, the number of IC chips provided over a printed wiring board that is provided in an external portion can be reduced, making it possible to realize the miniaturization and reduction in thickness of the display device.

Further, data written in the memory element 16 that is included in the memory cell 14 is read out by utilizing an electric effect. Specifically, the data is read out by applying a voltage between the first conductive layer 20 and the second conductive layer 22 of the capacitor element 16 and reading out the resistance of the memory element 16. When reading out the data in such a manner, the memory element 16 sometimes emits light upon being applied with the voltage.

Accordingly, in the case where the organic compound layers 18 included in the light emitting elements 15 and the organic compound layers 21 included in the memory elements 16 are made from a same material, a housing is preferably arranged such that the memory cell portion 12 and the light emission of the memory elements 16 are not recognized by sight. This is effective in the case of using this display device of the invention as an electronic appliance.

Also, the organic compound layers 18 included in the light emitting elements 15 and the organic compound layers 21 included in the memory elements 16 may be formed to have different structures from each other. For instance, each organic compound layer 18 may be formed to have a five layered structure including an electron injecting layer, an electron transporting layer, a light emitting layer, a hole transporting layer and a hole injecting layer. Each organic compound layer 21 may be formed to have the above mentioned layers except for the light emitting layer. Concretely, the organic compound layer 21 may have a structure only including an electron injecting layer, or a structure only including an electron injecting layer and an electron transporting layer, or a structure only including a hole transporting layer and a hole injecting layer. Such a structure allows the memory elements 16 to emit no light when being applied with the voltage.

Further, light emitted from the light emitting elements 15 includes light emission (phosphorescence) upon returning to a ground state from a singlet excited state and light emission (fluorescence) upon returning to a ground state from a triplet excited state. One or both of the phosphorescence and fluorescence can be employed.

Next, the case B where the pixel portion 11 has the active matrix type and the memory cell portion 12 has the active matrix type will be described with reference to FIGS. 3A to 3C and FIGS. 4A and 4B.

Figure 3A:
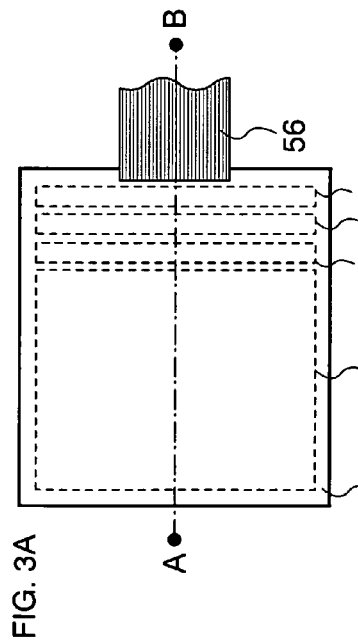
FIGS. 3A to 3C are diagrams showing a display device according to the invention (Embodiment Mode 1)

The pixel portion 11 and the memory cell portion 12 are provided over the substrate 25. In FIG. 3A, driver circuit portions 61 and 62 are also provided over the substrate 25. The driver circuit portions 61 and 62 include a plurality of transistors for controlling one or both of the pixel portion 11 and the memory cell portion 12. The driver circuit portions 61 and 62 may not be provided, if unnecessary.

Figure 3B:
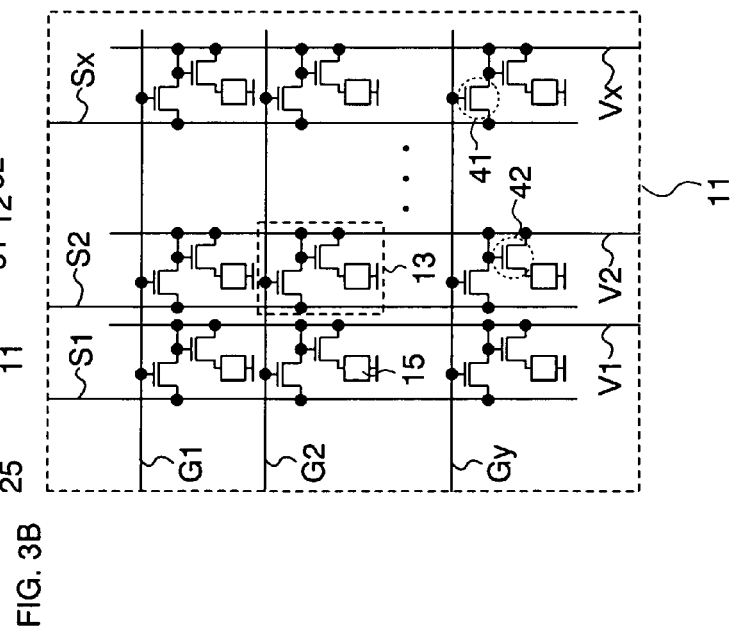
Figure 3C:
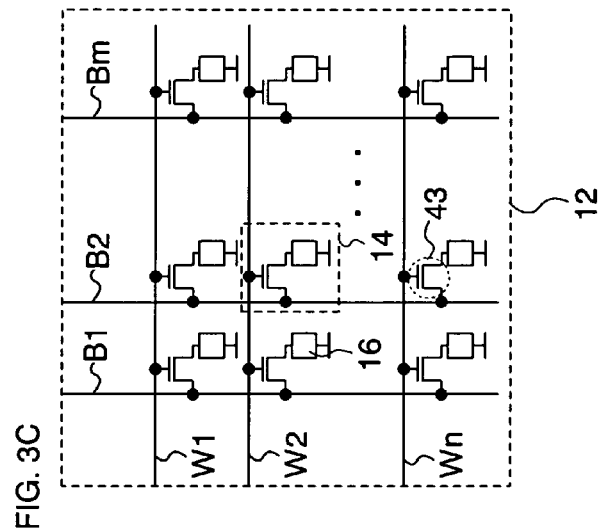

The pixel portion 11 includes a plurality of pixels 13 while the memory cell portion 12 includes a plurality of memory cells 14 (see FIGS. 3B and 3C). Also, the pixels 13 comprise light emitting elements 15, switching transistors (also referred to as first transistors) 41 for controlling the input of image signals to the pixels 13, and driving transistors (also referred to as second transistors) 42 for controlling the supply of current flowing through the light emitting elements 15, respectively. The memory cells 14 comprise memory elements 16 and switching transistors 43 for controlling the read-out or write-in operation of data with respect to the memory elements 16, respectively. Further, the pixel portion 11 includes a plurality of first wirings Sa ($1 \leq a \leq x$, wherein a and x are natural numbers) extending in a first direction, a plurality of second wirings Gb ($1 \leq b \leq y$, wherein b and y are natural numbers) extending in a second direction perpendicular to the first direction, and a plurality of third wirings Va ($1 \leq a \leq x$, also referred to as power supply lines) extending in the first direction. The memory cell portion 12 includes a plurality of first wirings Ba ($1 \leq a \leq m$, wherein m is a natural number) extending in the first direction and a plurality of second wirings Wb ($1 \leq b \leq n$, wherein n is a natural number) extending in the second direction perpendicular to the first direction.

Next, a cross sectional structure of the display device having the above structure will be described. Lines A-B of cross sectional views as shown in FIGS. 4A and 4B correspond to a line A-B of a top view of FIG. 3A.

In the pixel portion 11, the light emitting element 15 is provided, and the light emitting element 15 comprise a first conductive layer 44, an organic compound layer 45, and a second conductive layer 46 (see FIG. 4A). The first conductive layer 44, the organic compound layer 45 and the second conductive layer 46 are laminated. The first conductive layer 44 included in the light emitting element 15 is connected to a conductive layer 50 that functions as a source wiring or a drain wiring of the driving transistor 42. An insulating layer 58 functioning as a bank is provided between the adjacent light emitting elements 15.

In the memory cell portion 12, the memory elements 16 are provided. Each memory element 16 comprises a first conductive layer 47, an organic compound layer 48, and a second conductive layer 49 (see FIG. 4B). The first conductive layer 47, the organic compound layer 48 and the second conductive layer 49 are laminated. The first conductive layer 47 included in the memory element 16 is connected to a conductive layer 51 that serves as a source wiring or a drain wiring of the switching transistor 43. An insulating layer 59 serving as a bank is provided between the adjacent memory elements 16.

An element group 52 is provided in the driver circuit portion 61. An element group 53 is provided in the driver circuit portion 62. The element groups 52 and 53 include a plurality of transistors. The element group 52 constitutes a driver circuit for controlling the operation of the pixel portion 11. The element group 53 constitutes a driver circuit for controlling the operation of the memory cell portion 12. The driver circuit for controlling the operation of the pixel portion 11 corresponds to, for example, a shift register, a decoder, a buffer, a sampling circuit, a latch and the like. Also, the driver circuit for controlling the operation of the memory cell portion 12 corresponds to, for example, a decoder, a sense amplifier, a selector, a buffer, a read-out circuit, a write-in circuit, and the like.

A sealing material 54 is provided over the substrate 25. The substrate 25 and a counter substrate 29 are attached to each other with the sealing material 54. A connection film 56 that connects to a connection conductive layer 57 through an anisotropic conductive layer 55 is also provided over the substrate 25. Signals for controlling the operation of plural elements that constitute the pixel portion 11, the memory cell portion 12 and the driver circuit portions 61 and 62 and the power potential are input from an external portion through the connection film 56.

The connection conductive layer 57 is connected to a conductive layer 36. The conductive layer 36 is connected to a gate electrode of a transistor included in the element group 53 or a source wiring or a drain wiring that is connected to a transistor included in the element group 53.

In the case where the organic compound layer 45 included in the light emitting element 15 and the organic compound layer 48 included in the memory element 16 are formed using a same material, a housing is preferably arranged such that the memory cell portion 12 is not recognized by sight so as not to recognize the light emission of the memory element 16 by sight. This is effective in the case of using the display device of the invention for an electronic appliance.

Alternatively, the organic compound layer 45 included in the light emitting element 15 and the organic compound layer 48 included in the memory element 16 may be formed to have different structures from each other. This allows the memory element 16 to emit no light upon being applied with a voltage.

Further, the above described structure shows a bottom emission structure in that light generated in the light emitting elements 15 is emitted toward the substrate 25. However, the prevent invention is not limited to this structure. Alternatively, a top emission structure in that light generated in the light emitting elements 15 is emitted toward the counter substrate 29 may be employed. Also, a dual emission structure in that light generated in the light emitting elements 15 is emitted toward both the substrate 25 and the counter substrate 29 may be employed by forming the first and second conductive layers 44 and 46 using a material with a light transmitting property or by forming the first and the second conductive layers to have a thickness that can transmit light.

Next, the case C where the pixel portion 11 has the active matrix type and the memory cell portion 12 has the passive matrix type will be described with reference to FIGS. 5A to 5C, FIGS. 6A and 6B, FIGS. 7A to 7C and FIG. 8.

Figure 5A:
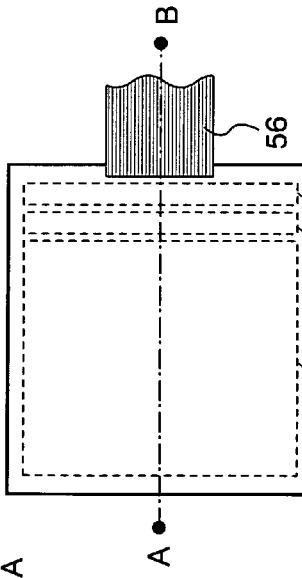
FIGS. 5A to 5C are diagrams showing a display device according to the invention (Embodiment Mode 1)

The pixel portion 11 and the memory cell portion 12 are provided over a substrate 25. A driver circuit portion 63 is also provided over the substrate 25 in the structure as shown in FIG. 5A. The driver circuit portion 63 includes a plurality of transistors that control one or both of the pixel portion 11 and the memory cell portion 12. The driver circuit portion 63 may not be provided, if unnecessary.

Figure 1C:
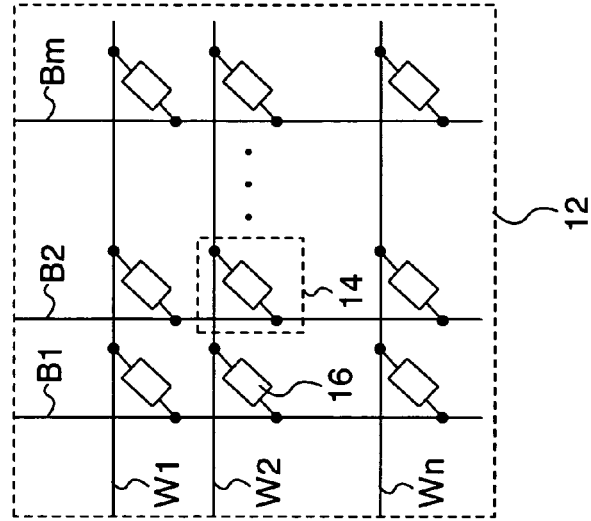
Figure 1B:
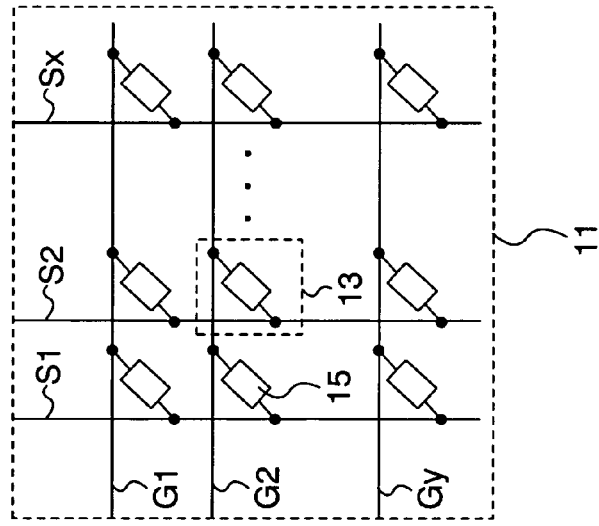
Figure 5B:
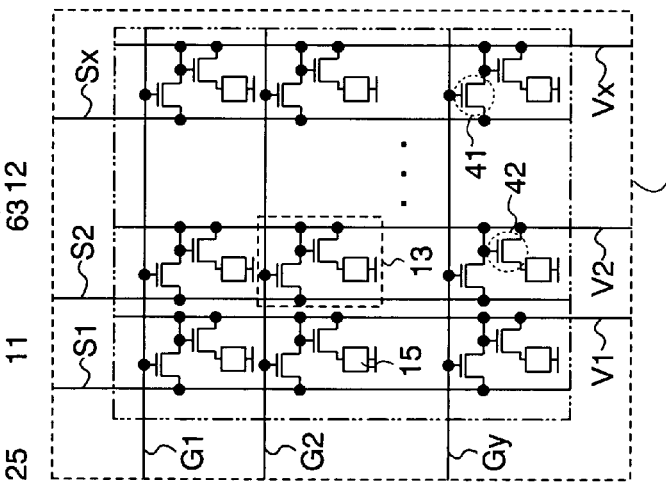
Figure 5C:
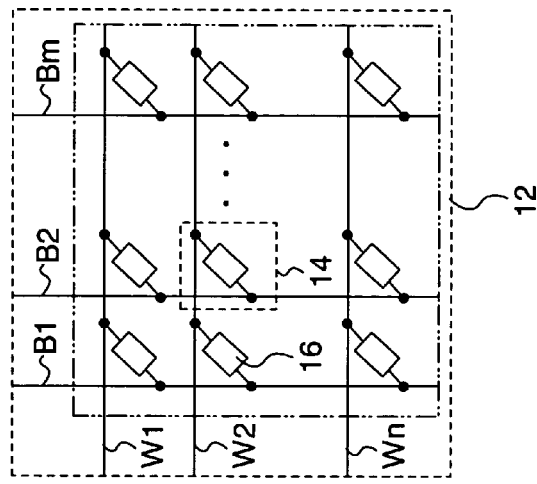

The pixel portion 11 comprises a plurality of pixels 13 while the memory cell portion 12 comprises a plurality of memory cells 14 (see FIGS. 5B and 5C). The pixel portion 11 as shown in FIG. 5B has the same structure as the pixel portion 11 as shown in FIG. 3B whereas the memory cell portion 12 as shown in FIG. 5C has the same structure as the memory cell portion 12 as shown in FIG. 1C.

Next, a cross sectional structure of the display device having the above mentioned structure will be described with reference to FIGS. 6A and 6B. A line A-B in a cross sectional view of FIG. 6A corresponds to a line A-B in a top view of FIG. 5A. Further, there are following two types of cross sectional structures: one case where the memory cell portion 12 and the driver circuit portion 63 are provided in a same layer (see FIG. 6A); and the other case where the memory cell portion 12 is laminated on the driver circuit portion 63 (see FIG. 6B).

At first, the former type of the cross sectional structure is described (see FIG. 6A). In the pixel portion 11, a driving transistor 42 and a light emitting element 15 are provided. The cross sectional structure of the pixel portion 11 is same as that of the pixel portion 11 as shown in FIG. 4A. In the memory cell portion 12, memory elements 16 are provided. The cross sectional structure of the memory cell portion 12 is same as that of the memory cell portion 12 as shown in FIG. 2B.

One feature of the above mentioned structure is that the pixel portion 11 having the active matrix type and the memory cell portion 12 having the passive matrix type are provided over the same substrate 25. Another feature thereof is that a first conductive layer 20 of the memory elements 16 is connected to a conductive layer 64 that serves as a source wiring or a drain wiring of a transistor included in an element group 60.

Next, the latter type of the cross section structure is described (see FIG. 6B). In the pixel portion 11, the driving transistor 42 and the light emitting element 15 are provided. The cross sectional structure of the pixel portion 11 as shown in FIG. 6B is same as the cross sectional structures of the pixel portions 11 as shown in FIG. 4A and FIG. 6A. In the memory cell portion 12, the memory elements 16 are provided. The cross sectional structure of the memory cell portion 12 as shown in FIG. 6B is same as the cross sectional structures of the memory cell portions 12 as shown in FIG. 2B and FIG. 6A.

One feature of the above mentioned structure is that the pixel portion 11 having the active matrix type and the memory cell portion 12 having the passive matrix type are provided over the same substrate 25. Another feature thereof is that the memory cell portion 12 is laminated on a driver circuit portion 63.

A sealing material 54 is provided over the substrate 25 so that the substrate 25 and a counter substrate 29 are attached to each other with the sealing material 54. Also, a connection film 56 connecting to a connection conductive layer 57 through an anisotropic conductive layer 55 is provided over the substrate 25. Signals for controlling the operation of respective elements that constitute the pixel portion 11, the memory cell portion 12 and the driver circuit portion 63 and the power potential are input from an external portion through the connection film 56.

The connection conductive layer 57 is connected to a conductive layer 36. The conductive layer 36 is connected to a gate electrode of a transistor included in the element group 60 or a source wiring or a drain wiring that is connected to a transistor included in the element group 60.

Next, a display device of the invention having a different structure from the above described structures will be described with reference to FIGS. 7A to 7C and FIG. 8.

Figure 7A:
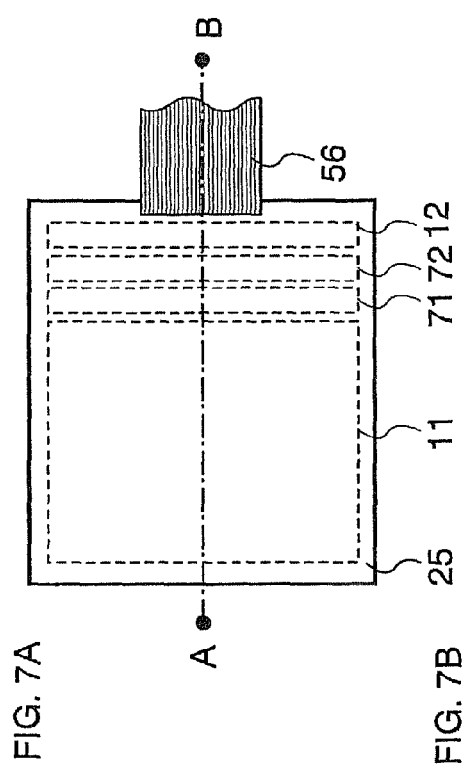
FIGS. 7A to 7C are diagrams showing a display device according to the invention (Embodiment Mode 1)
Figure 7B:
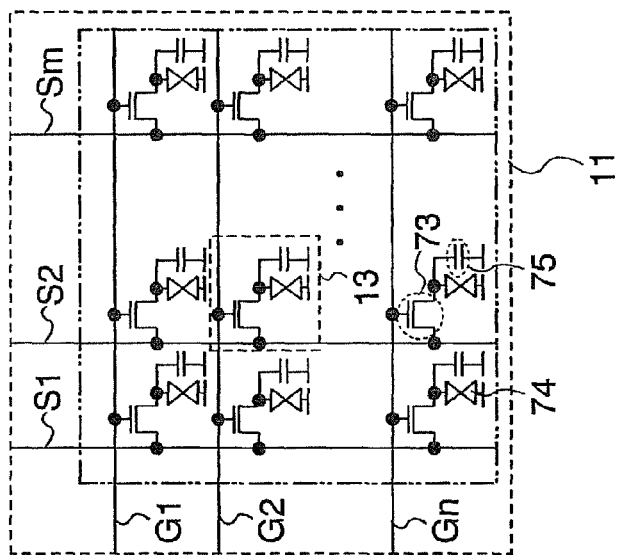
Figure 7C:
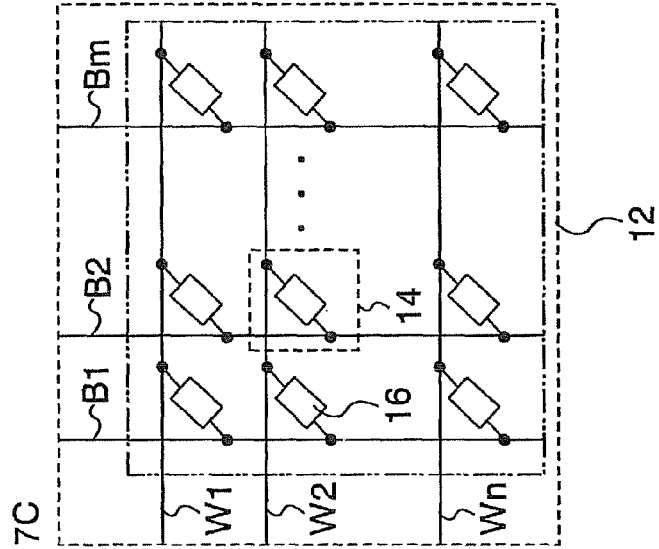

A pixel portion 11 and a memory cell portion 12 are provided over a substrate 25. In the structure as shown in FIG. 7A, driver circuit portions 71 and 72 are also provided over the substrate 25. The driver circuit portions 71 and 72 include a plurality of transistors controlling one or both of the pixel portion 11 and the memory cell portion 12. The driver circuit portions 71 and 72 may not be provided, if unnecessary.

The pixel portion 11 comprises a plurality of pixels 13. The memory cell portion 12 comprises a plurality of memory cells 14. The pixels 13 include switching transistors 73 for controlling input of image signals to the pixels 13 and liquid crystal elements 74, respectively. The pixel portion 11 also includes a plurality of first wirings Sa ($1 \leq a \leq x$, wherein a and x are natural numbers) extending in a first direction and a plurality of second wirings Gb ($1 \leq b \leq y$, wherein b and y are natural numbers) extending in a second direction perpendicular to the first direction. Further, the memory cell portion 12 has the same structure as the memory cell portion 12 as shown in FIG. 1C.

Next, a cross sectional structure of the display device with the above described structure will be described with reference to FIG. 8. A line A-B in a cross sectional view of FIG. 8 corresponds to a line A-B in a top view of FIG. 7A.

In the pixel portion 11, a switching transistor 73, a liquid crystal element 74 and a capacitor element 75 are provided. The liquid crystal element 74 includes a first conductive layer 76 serving as a pixel electrode, a liquid crystal layer 80, and a second conductive layer 78 serving as a counter electrode. An orientation layer 77 is provided between the first conductive layer 76 and the liquid crystal layer 80. Also, an orientation layer 79 is provided between the second conducive layer 78 and the liquid crystal layer 80.

In the memory cell portion 12, memory elements 16 are provided. The cross sectional structure of the memory cell portion 12 shown in FIG. 8 corresponds to the cross sectional structures of the memory cell portions 12 shown in FIG. 2B, FIGS. 6A and 6B.

An element group 82 is provided in the driver circuit portion 71. An element group 83 is provided in the driver circuit portion 72. The element groups 82 and 83 include a plurality of transistors, respectively. The element group 82 constitutes a driver circuit for controlling the operation of the pixel portion 11 whereas the element group 83 constitutes a driver circuit for controlling the operation of the memory cell portion 12.

A sealing material 54 is provided over the substrate 25. The substrate 25 and a counter substrate 29 are attached to each other with the sealing material 54. A connection film 56 connecting to a connection conductive layer 57 through an anisotropic conductive layer 55 is also provided over the substrate 25. Signals for controlling plural elements that constitute the pixel portion 11, the memory cell portion 12 and the driver circuit portions 71 and 72 and the power potential are input from an external portion through the connection film 56.

Figure 8:
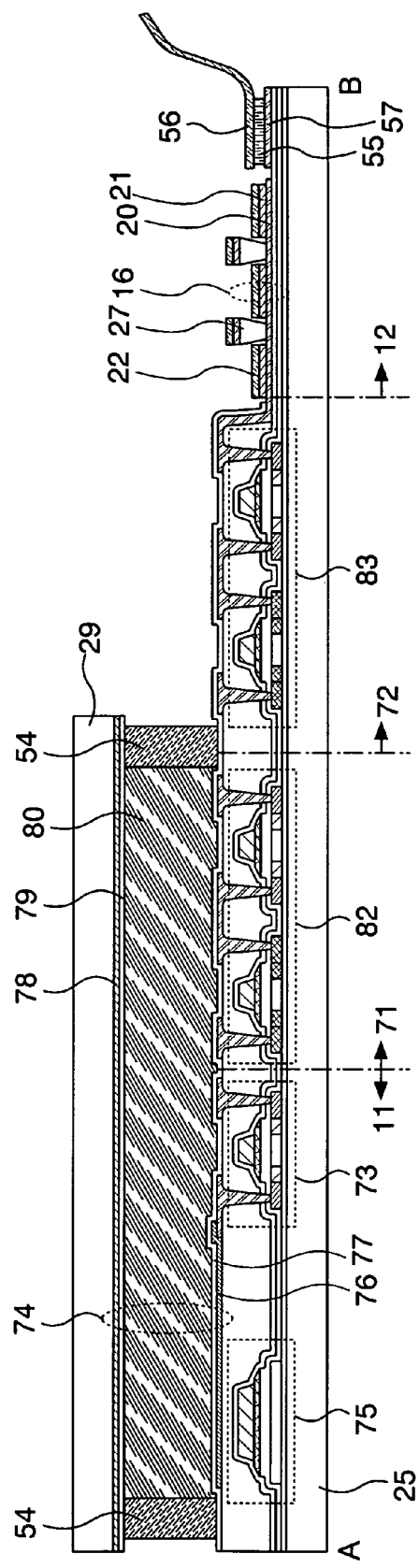
FIG. 8 is a cross sectional view showing a display device according to the invention (Embodiment Mode 1)

One feature of the substrate as shown in FIG. 8 is that the pixel portion 11 having the active matrix type and the memory cell portion 12 having the passive matrix type are provided over the same substrate 25. Another feature thereof is that the liquid crystal layer 80 is provided between the substrate 25 and the counter substrate 29.

[Embodiment Mode 2]

The operation of a memory circuit included in a display device of the invention will be described with reference to FIGS. 9A and 9B and FIGS. 10A and 10B. The memory circuit comprises a memory cell portion 12 in which memory cells 14 are arranged in a matrix form, decoders 123 and 124, a selector 125, and a read-out/write-in circuit 126 (see FIG. 9A).

Figure 10A:
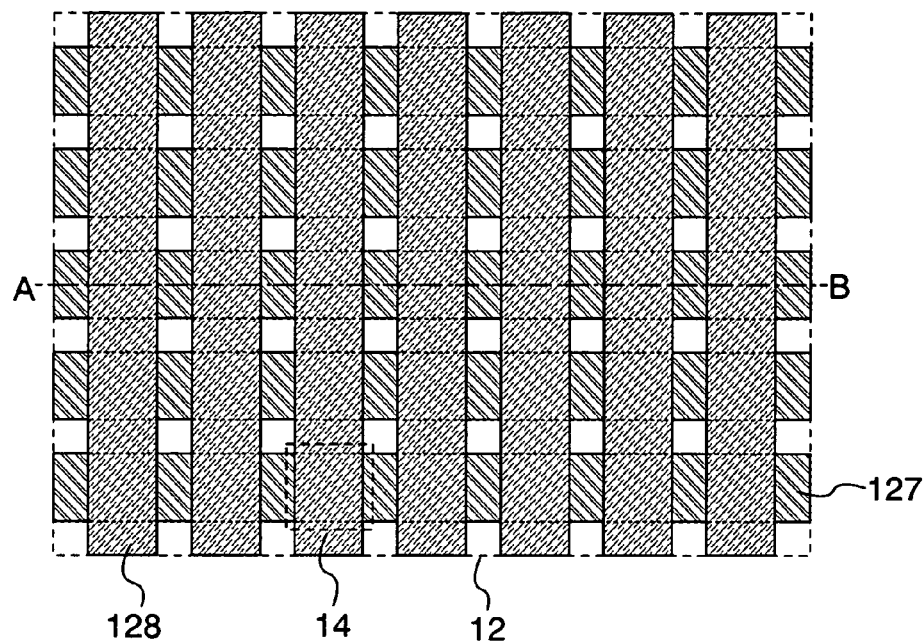
FIGS. 10A to 10C are diagrams showing a display device according to the invention (Embodiment Mode 2)

The memory elements 16 comprise first conductive layers 127 serving as first wirings Ba ($1 \leq a \leq m$), second conductive layers 128 serving as second wirings Wb ($1 \leq b \leq n$), and organic compound layers 129 provided between the first conductive layers 127 and the second conductive layers 128, respectively (see FIG. 10A). A laminated body including the first conductive layer 127, the organic compound layer 129 and the second conductive layer 128 corresponds to one memory element 16. Insulating layers 133 are provided between the adjacent organic compound layers 129.

The first conductive layers 127 serving as the first wirings Ba are provided to extend in a first direction while the second conductive layers 128 serving as word lines Wb are provided to extend in a second direction being perpendicular to the first direction. That is, the first conductive layers 127 and the second conductive layers 128 intersect one another in a matrix form.

Further, data is sometimes written in the memory element 16 by utilizing an optical effect depending on a structure of the organic compound layer 129, though that will be mentioned later. In this case, one or both of the first conductive layer 127 and the second conductive layer 128 is/are necessary to have a light transmitting property. A conductive layer having the light transmitting property is formed using a transparent conductive material such as indium tin oxide (ITO). Alternatively, a material other than the transparent conductive material is formed to have a thickness that can transmit light.

Figure 9A:
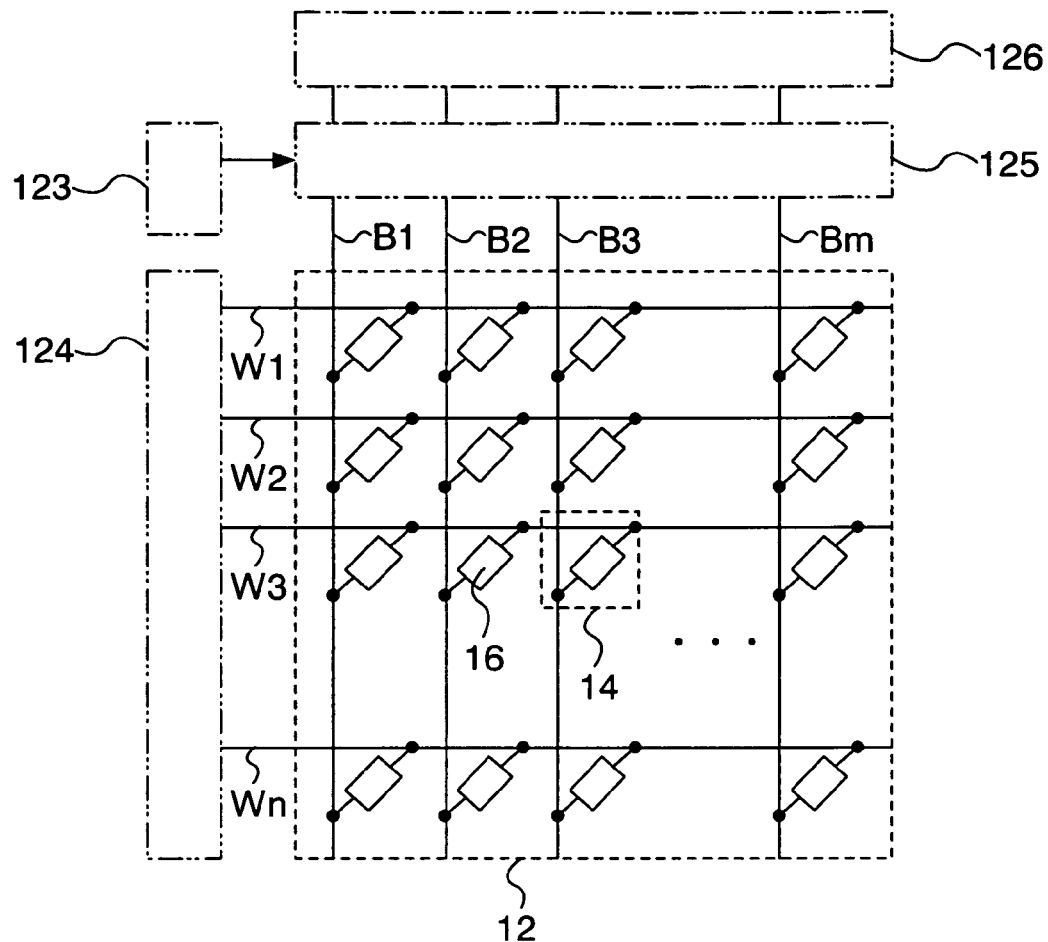
FIGS. 9A and 9B are diagrams showing a display device according to the invention (Embodiment Mode 2)

An equivalent circuit diagram as shown in FIG. 9A shows a case of the passive matrix type. Alternatively, an active matrix type where the memory elements 16 and the switching transistors 43 are provided in respective memory cells 14 as shown in FIG. 3C may be employed.

The first conductive layers 127 and the second conductive layers 128 can be formed using a known material. Either the first conductive layers 127 or the second conductive layers 128 serve as anodes and the others serve as cathodes.

As a material for the anodes, a metal material that have a large work function (preferably, 4.0 eV or more), an alloy material, and a conductive compound material are preferably used. Also, a mixture of these materials, and the like are preferably used. Concretely, indium tin oxide, indium tin oxide containing silicon, indium oxide containing 2 to 20% zinc oxide (ZnO), gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride) and the like can be given.

On the other hand, as a material for the cathodes, a metal material that have a small work function (preferably, 3.8 eV or less), an alloy material, and a conductive compound material are preferably used. Also, a mixture of these materials, and the like are preferably used. Concretely, metal belonging to group 1 or 2 of the periodic table, i.e., alkali metal such as lithium (Li) and cesium (Cs), alkali earth metal such as magnesium (Mg), calcium (Ca) and strontium (Sr), an alloy including the alkali metal and alkali earth metal (e.g., MgAg, AlLi and the like), rare earth metal such as europium (Er) and ytterbium (Yb), an alloy including the rare earth metal, and the like can be given. Furthermore, by utilizing an electron injecting layer with a strong electron injecting property, a material with a large work function, i.e., a material that is usually used for an anode can be used to form a cathode. For example, a cathode can be formed using a conductive inorganic metal compound such as Al, Ag and ITO.

The organic compound layers 129 can be formed using a known material. A low molecular weight material, a high molecular weight material, a singlet material, and a triplet material can be employed. Also, the organic compound layers 129 can be formed not only using an organic compound material but also using an organic material that contains an inorganic compound partly. Further, each organic compound layer 129 is formed by arbitrarily combining a hole injecting layer, a hole transporting layer, a hole blocking layer, a light emitting layer, an electron transporting layer, an electron injecting layer and the like. The organic compound layer may include a single layer or plural layers. Alternatively, the organic compound layer may have a mixed structure including plural layers wherein an interface between the layers is indistinct. The organic compound layers 129 are formed by a droplet discharging method typified by an ink-jet method, evaporation, or the like. By utilizing the droplet discharging method, a display device, in which the utilization efficiency of a material is improved and manufacturing time and manufacturing cost are reduced due to simplified manufacturing process, can be provided.

As a specific organic compound material for the organic compound layers 129, for example, it is possible to use a substance with an excellent hole transporting property, e.g., an aromatic amine (i.e., which has a benzene ring-nitrogen bond) compound such as 4,4'-bis[N-(1-naphthyl)-N-phenyl-amino]-biphenyl (abbreviation: α-NPD), N,N'-bis(3-methylphenyl)-N,N'-diphenyl benzine (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA); a phthalocyanine compound such as phthalocyanine (abbreviation: $H_2Pc$), copper phthalocyanine (abbreviation: CuPc) and vanadyl phthalocyanine (abbreviation: VOPc); and the like.

Also, a material with an excellent electron transporting property can be used as the organic compound material. For example, a material including a metal complex with quinoline skeleton or benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolate-aluminum (abbreviation: BAlq); and a metal complex having oxazole ligand or thiazole ligand such as bis[2-(2-hydroxyphenyl)benzoxazolate]zinc (abbreviation: Zn $(BOX)_2$) and bis[2-(2-hydroxyphenyl)benzothiazolate]zinc (abbreviation: $Zn(BTZ)_2$) can be used. Additionally, besides the metal complexes, a compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), and bathocuproin (abbreviation: BCP) can be used.

In addition, as the organic compound material, 4-(dicyanomethylene)-2-methyl-6-[2-(1,1,7,7-tetramethyljulolidin-9-yl)ethenyl]-4H-pyra n (abbreviation: DCJT); periflanthene; N,N'-dimethylquinacridon (abbreviation: DMQd); coumarin 6; coumarin 545T; 9,9'-bianthryl; 9,10-diphenylanthracene (abbreviation: DPA); 9,10-di(2-naphthyl)anthracene (abbreviation: DNA); 2,5,8,11-tetra-t-butylperylene (abbreviation: TBP); and the like can be given. Also, as a host material into which the above-mentioned light emitting material is dispersed, for example, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as bis[2-(2-hydroxyphenyl)pyridinato] zinc (abbreviation: $Znpp_2$), and bis[2-(2'-hydroxyphenyl) benzoxazolato]zinc (abbreviation: ZnBOX); and the like can be used. Moreover, bis(2-methyl-8-quinolinolato)(4-phenylphenolate)aluminum (abbreviation: BAlq) and the like can be used.

Also, the above-mentioned organic compound material mixed with a metal oxide material can be used. As the metal oxide material, for example, molybdenum oxide, zinc oxide, indium oxide and the like can be given. Preferably, an organic compound material mixed with one or more of these metal oxide materials may be used.

Further, the organic compound layers 129 can be formed using a material of which its property is changed by an optical effect. For example, a conjugated polymer doped with a compound that generates acid by absorbing light (i.e., photo acid generator) can be used. As the conjugated polymer, polyacetylene, polyphenylene vinylene, polythiophene, polyaniline, polyphenylene ethynylene, and the like can be used. Also, as the photo acid generator, aryl sulfonium salt, aryl iodonium salt, o-nitrobenzyl tosylate, aryl sulfonic acid p-nitrobenzyl ester, sulfonyl acetophenone, Fe-allene complex PF6 salt, and the like can be used.

Next, an operation in writing data in the memory circuit with the above described structure will be described. Further, the data is written in the memory circuit by utilizing an optical effect or an electric effect.

At first, a case of writing data in the memory circuit by utilizing an electric effect will be described (see FIG. 9A).

In this case, one memory cell 14 is selected by the decoders 123 and 124 and the selector 125. Thereafter, the data is written in the selected memory cell 14 by the read-out/write-in circuit 126. Specifically, a desired voltage is applied to the memory element 16 included in the selected memory cell 14 to flow a large amount of current through the memory element so that a pair of conductive layers included in the memory element 16 is short circuited each other. The resistance of the short-circuited memory element 16 is drastically lowered as compared with other memory elements 16. Accordingly, the data is written in the memory circuit by utilizing a mechanism where the resistance of the memory element 16 is changed by being added with the electric effect. For example, when data "1" is written in one memory element 16 that has data "0" before being applied with the electric effect, a voltage is applied to the memory element 16 to flow a large amount of current therethrough so that the memory element 16 is short circuited.

Furthermore, the present invention is not limited to the method in that data is written in the memory cell by applying a desired voltage to the memory element 16 and short circuiting the memory element. Alternatively, by adjusting an element structure of the memory element 16 and controlling the voltage applied to the memory element, a desired voltage may be applied to the memory element 16 to electrically isolate the organic compound layer 129 interposed between the pair of conductive layers. This allows the data to be written in the memory cell. In this case, the resistance of the memory element 16 including the electrically-isolated organic compound layer 129 is extremely increased as compared with other memory elements 16. Accordingly, data is written in the memory circuit by utilizing a mechanism where the resistance of the memory element 16 is changed by being added with the electric effect. For instance, when data "1" is written in one memory element 16 that has data "0" before being applied with the electric effect, a voltage is applied to the selected memory element 16 so as to electrically isolate the organic compound layer 129 interposed between the pair of conductive layers.

Figure 10B:
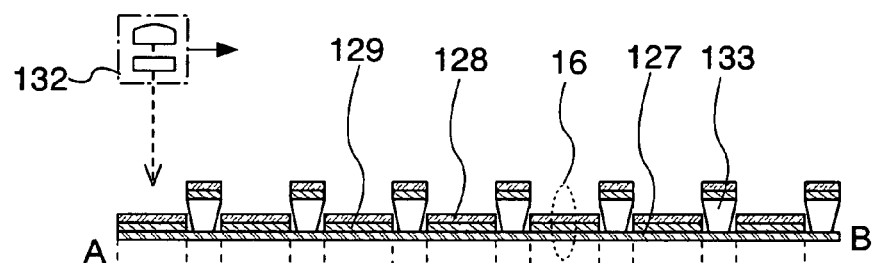
Figure 10C:
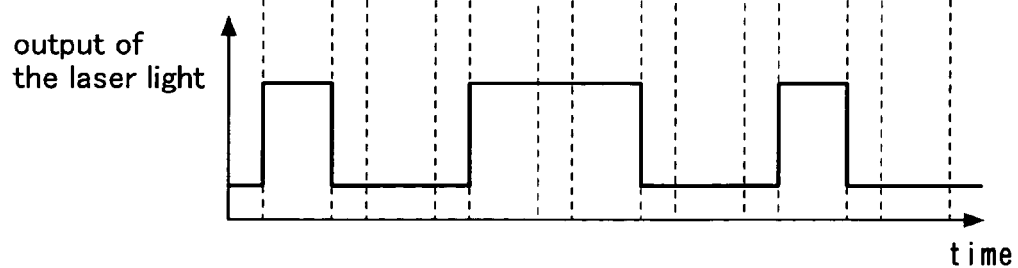

Next, a case where data is written in a memory circuit by utilizing an optical effect will be described (see FIGS. 10B and 10C). In this case, the data is written in a memory cell by irradiating the organic compound layer 129 with laser light using a laser irradiating apparatus 132 from a side of the conductive layer with the light transmitting property (which corresponds to the second conductive layer 128 here). Concretely, the organic compound layer 129 included in the selected memory element 16 is irradiated with laser light to destroy the organic compound layer 129. The destroyed organic compound layer 129 is electrically isolated so that the resistance of the selected memory element 16 is extremely increased as compared with other memory elements 16. Accordingly, data is written in the memory circuit by utilizing a mechanism in that the resistance of the memory element 16 is changed by being irradiated with laser light. For example, when data "1" is written in one memory element 16 that has data "0" before being irradiated with laser light, the resistance of the memory element 16 is increased by irradiating the memory element with laser light to destroy the organic compound layer 129.

Furthermore, the present invention is not limited to the method in which data is written in the memory circuit by irradiating the memory element 16 with laser light to electrically isolate the organic compound layer 129. Alternatively, an element structure of the memory element 16 may be changed and the intensity of the laser light may be adjusted, and then, the memory element 16 may be irradiated with the laser light to destroy the organic compound layer 129. By destroying the organic compound layer, the pair of conductive layers are short circuited each other so that the data is written in the memory circuit. In this case, the resistance of the memory element 16 in which the pair of conductive layers are short circuited each other is extremely lowered as compared with other memory elements 16. The data may be written in the memory circuit by utilizing a mechanism in that the resistance of the memory element 16 is changed by being applied with an optical effect.

Meanwhile, in the case where a conjugated polymer doped with a compound that generates acid by absorbing light (i.e., a photo acid generator) is used as the organic compound layer 129, when the organic compound layer 129 is irradiated with laser light, a conducting property of the organic compound layer 129 irradiated with laser light is increased so that the resistance of the memory element 16 is lowered. On the other hand, the other organic compound layers 129 that are not irradiated with laser light have no conducting properties, and hence, the resistance of the memory elements 16 having the organic compound layers is not varied. In this case, data is written in the memory circuit by utilizing a mechanism in that the resistance of the memory element 16 is changed by irradiating the selected organic compound layer 129 with laser light. For example, when data "1" is written in one memory element 16 that has data "0" before being irradiated with laser light, the organic compound layer 129 of the memory element 16 is irradiated with laser light to increase the conducting property of the organic compound layer 129.

Figure 9B:
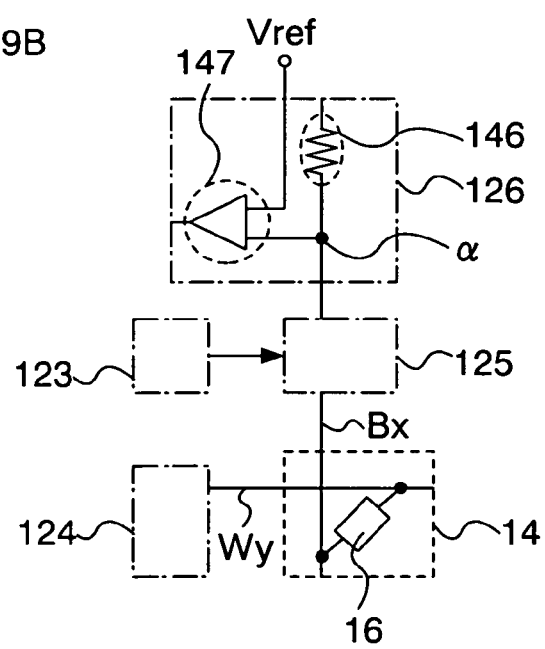

Subsequently, the operation in reading out data will be described (see FIGS. 9A and 9B). The read-out/write-in circuit 126 includes a resistive element 146 and a sense amplifier 147 here. Further, the read-out/write-in circuit 126 may comprise any structure without being limited to the above structure.

Data is read out by applying a voltage between the first conductive layer 127 and the second conductive layer 128 and reading out the resistance of the memory element 16. As described above, for instance, when data is written in the memory circuit by applying the electric effect, the resistance of the memory element 16, which is applied with the electric effect, is different from the resistance of other memory elements 16, which are not applied with the electric effect. By electrically reading out the difference in resistance of the memory elements, the data is read out.

Similarly, in the case of writing the data in the memory circuit by irradiating the organic compound layer 129 with laser light, by electrically reading out the difference in resistance between the memory element 16, which is applied with the optical effect, and the memory elements 16, which are not applied with the optical effect, the data is read out.

The same goes for the case where a conjugated polymer doped with a compound, which generates acid by absorbing light (i.e., the photo acid generator), is used as the organic compound layer 129. By electrically reading out the difference in resistance between the memory element 16, which is applied with the optical effect, and other memory elements, which are not applied with the optical effect, the data is read out.

For example, when data of one memory cell 14 that is positioned in an x-th column and in a y-th row among a plurality of memory cells 14 included in a memory cell portion 12 is read out, a bit line Bx in the x-th column and a word line Wy in the y-th row are selected by the decoders 123 and 124, and the selector 125. Thus, a memory element 16 included in the selected memory cell 14 and a resistive element 146 are connected in series. Upon applying a voltage to each end of the memory element 16 and the resistive element 146, which are connected in series, the potential at a node a becomes a potential that is lower than a potential at one end of the resistive element 146 in accordance with the resistance of the memory element 16. The potential at the node a is supplied to the sense amplifier 147. The sense amplifier 147 determines whether the potential has information about "0" or information about "1". Thereafter, a signal including the information about "0" or the information about "1" that is determined in the sense amplifier 147 is supplied to an external portion.

According to the above described method, information of the memory element 16 is read out depending on the amount of voltage by utilizing the difference in resistance. Alternatively, a method for comparing the amount of current may be used. Concretely, for example, this method utilizes the difference in the amount of current due to difference in resistance between the memory element 16, which is applied with an electric effect, and other memory elements 16, which are not applied with the electric effect. By electrically reading out the difference in the amount of current in this manner, data may be read out.

As a structure different of the above structure, a rectifying element may be provided between the first conductive layer 127 and the organic compound layer 129. As the rectifying element, a transistor or a diode where a gate electrode and a drain electrode are connected to each other can be given. As the diode, a diode including a PN junction, a diode including a PIN junction, or an avalanche diode may be used.

Since current flows only in one direction by providing the rectifying element in such a manner, the error is reduced, thereby improving the read-out margin.

[Embodiment 1]

Figure 11A:
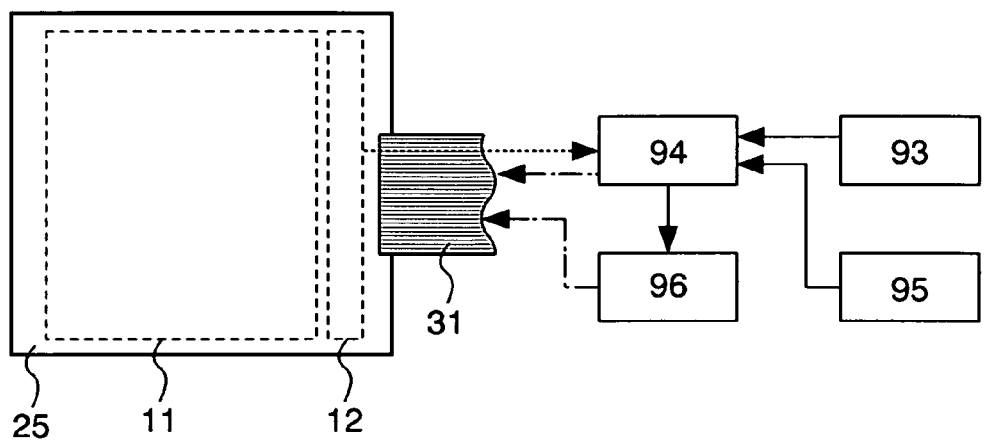
FIGS. 11A to 11C are diagrams showing a display device according to the invention (Embodiment 1)
Figure 11B:
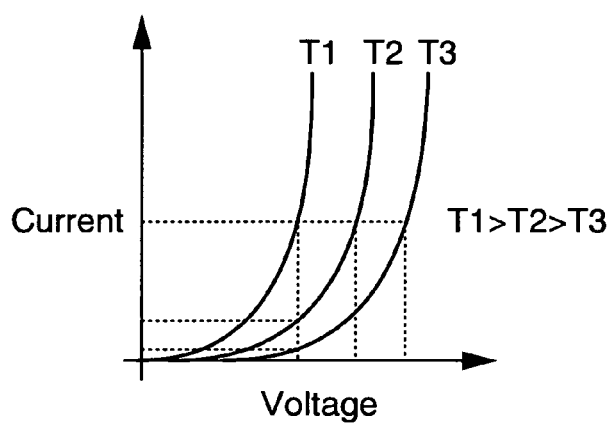
Figure 11C:
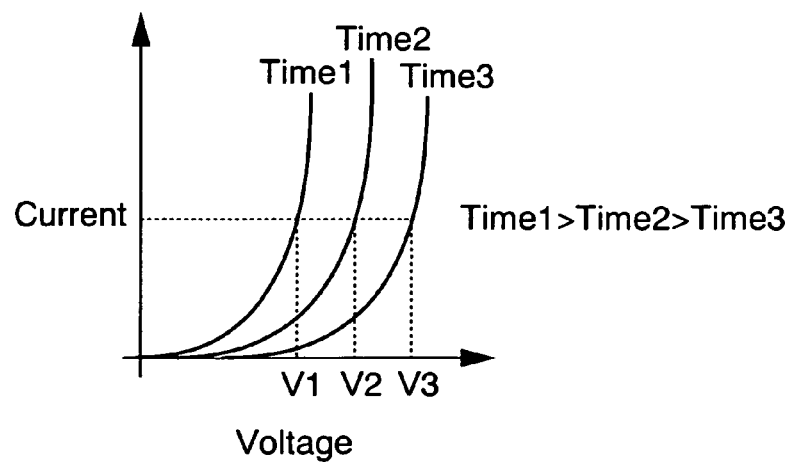

A light emitting element has a characteristic in that the resistance is changed in accordance with the ambient temperature. Specifically, in the case where room temperature is set to be normal temperature, when the temperature of the light emitting element becomes higher than the room temperature, the resistance is reduced, whereas when the temperature of the light emitting element is lower than the room temperature, the resistance is increased. When the temperature of the light emitting element is increased, the amount of current is increased to obtain luminance that is higher than the desired level of luminance. When the temperature of the light emitting element is lower than the room temperature, the amount of current is reduced to obtain luminance that is lower than the predetermined level of luminance. In addition, the light emitting element has a characteristic in that the resistance is also changed over time. Concretely, the resistance is increased over time. Accordingly, the amount of current is reduced over time so that the luminance is lower than the desired level of luminance. Therefore, a method for correcting the change in characteristics of the light emitting element with the ambient temperature or time passage will be described using a memory circuit included in a display device of the invention with reference to FIGS. 11A to 11C.

A pixel portion 11 and a memory cell portion 12 are provided over a substrate 25. A time detection circuit 93, a correction circuit 94, a temperature detection circuit 95 and a power supply circuit 96 are provided outside of the substrate 25 (see FIG. 11A). The elements provided over the substrate 25 are electrically connected to the time detection circuit 93, the correction circuit 94, the temperature detection circuit 95 and the power supply circuit 96 through a connection film 31. Further, elements constituting the time detection circuit 93, the correction circuit 94, the temperature detection circuit 95 and the power supply circuit 96 may be provided over the substrate 25, if possible.

A memory circuit includes a plurality of elements provided in the memory cell portion 12. Data about current-voltage characteristics of a light emitting element is stored in the memory circuit. Concretely, a temperature change characteristic of the current-voltage characteristics of the light emitting element (see FIG. 11B) and a time characteristic of the current-voltage characteristics (see FIG. 11C) are stored in the memory circuit.

The time detection circuit 93 detects lighting time of the light emitting element. The time detection circuit may detect the lighting time by detecting time of supplying power to the pixel portion 11, or by sampling an image signal that is input in a pixel within the pixel portion 11.

The temperature detection circuit 95 detects temperature. The temperature detection circuit includes a commercially-available temperature sensor, a light emitting element for a temperature monitor, and the like. Further, the light emitting element for the temperature monitor is an element that detects temperature by detecting variations in resistance of the light emitting element due to changes in temperature while flowing constant current between both electrodes.

The power supply circuit 96 supplies power to respective elements included in the pixel portion 11 and the memory cell portion 12 over the substrate 25.

The correction circuit 94 corrects one or both of an image signal input in a pixel within the pixel portion 11 and a power potential applied to the pixel portion 11 in order to correct changes in the characteristics of the light emitting element. The operation of the correction circuit 94 will be described in more detail below.

One or both of information about elapsed time and information about temperature is supplied to the correction circuit 94 from one or both of the time detection circuit 93 and the temperature detection circuit 95. Then, the correction circuit 94 compares information supplied from one or both of the time detection circuit 93 and the temperature detection circuit 95 with a temperature change characteristic or a temperature characteristic of the light emitting element that is stored in the memory circuit, and one or both of the image signal and the power potential is/are corrected to correct change in characteristics of the light emitting element.

Concretely, for example, when information about the temperature that is higher than the room temperature is obtained from the temperature detection circuit 95, one or both of a correction for reducing the gray scale number of the image signal and a correction for lowering the power potential is/are performed depending on the temperature characteristic of the light emitting element stored in the memory circuit so as to obtain the desired luminance.

Also, when information about the temperature that is lower than the room temperature is obtained from the temperature detection circuit 95, one or both of an operation for increasing the gray scale number of the image signal and an operation for increasing the power potential is/are performed depending on the temperature change characteristic of the light emitting element stored in the memory circuit so as to obtain the desired luminance.

Furthermore, when it is fount that the magnitude of change in the light emitting element over time is increased by comparing the information about lighting time obtained by the temperature detection circuit 93 with the temperature change characteristic stored in the memory circuit, one or both of an operation for increasing the gray scale number of the image signal and an operation for increasing the power potential is/are performed to obtain the desired luminance.

Since the operation of correcting the power potential is carried out for all pixels provided in the pixel portion 11, the power potential is preferably corrected in accordance with one light emitting element having the smallest magnitude of change in characteristics and corrected image signals are preferably supplied to other light emitting elements with the exception of the light emitting element having the smallest magnitude of change in characteristics.

[Embodiment 2]

A plurality of pixels 13 are provided in a pixel portion 11 included in a display device of the invention. As a circuit configuration of the pixels 13, the case of providing two transistors in each pixel is described above (see FIG. 3B and FIG. 5B). In this embodiment, another circuit configuration of the pixels 13 that is different from the above described configuration will be described with reference FIGS. 12A and 12B.

Figure 12A:
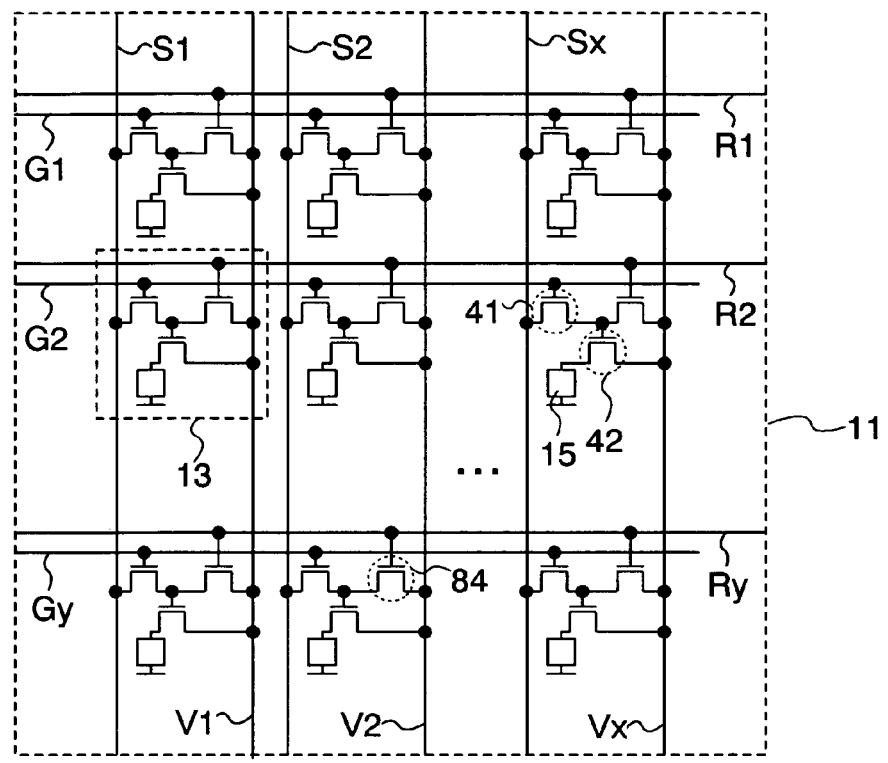
FIGS. 12A and 12B are diagrams showing a display device according to the invention (Embodiment 2)

A case of providing three transistors in each pixel 13 will be described (see FIG. 12A). In this case, a switching transistor 41 for controlling input of video signals to the pixel 13, a driving transistor 42 for controlling the amount of current flowing through a light emitting element 15, and an erasing transistor 84 for forcibly stopping the light emission of the light emitting element 15 are provided in each pixel 13. In the pixel portion 11, source lines Sa, power supply lines Va, gate lines Gb and reset lines Rb are provided. According to this configuration, it is possible to make a situation where the current does not flow through the light emitting element 15, forcibly. Therefore, a lighting period can start simultaneously with or immediately after a writing period starts before signals are written into all the pixels. As a consequence, the duty ratio can be improved, making it possible to display moving images favorably.

Figure 12B:
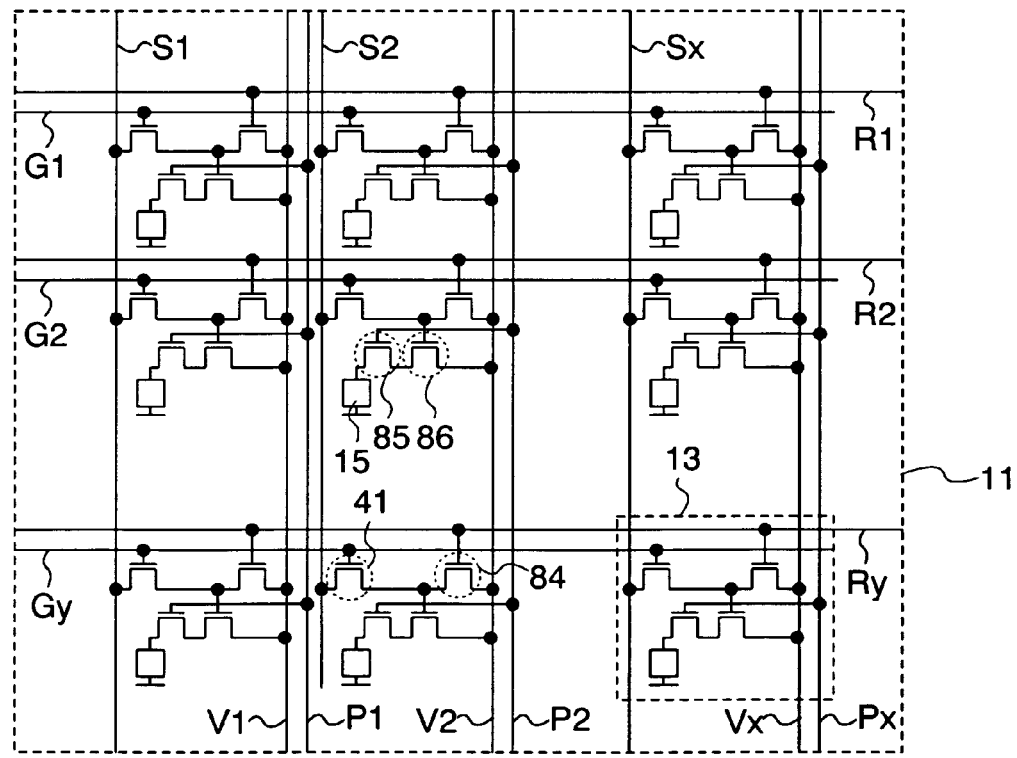

Next, a case of providing four transistors in each pixel 13 will be described (see FIG. 12B). In this case, a switching transistor 41 for controlling input of video signals with respect to the pixel 13, an erasing transistor 84 for forcibly stopping the light emission of the light emitting element 15, a driving transistor 85 for determining the amount of current flowing through the light emitting element 15, and a current controlling transistor for controlling the supply of current with respect to the light emitting element 15 are provided in each pixel 13. In the pixel portion 11, source lines Sa, power supply lines Va, power supply lines Pa, gate lines Gb, and reset lines Rb are also provided.

According to this configuration, a potential of a gate electrode of the driving transistor 85 is maintained at a constant level so as to flow current consistently while the driving transistor 85 is operated in a saturation region. On the other hand, the current controlling transistor 86 is operated in a linear region. The amount of voltage between a source and a drain of the current controlling transistor 86, which is operated in the linear region, is small. Therefore, slight variation in the voltage between the gate and the source of the current controlling transistor 86 does not adversely affect the amount of current flowing through the light emitting element 15. The amount of current flowing through the light emitting element 15 is determined by the driving transistor 85, which is operated in the saturation region. Consequently, the fluctuation in luminance of the light emitting element 15 due to variation in characteristics of the transistors can be improved, and hence, the quality of images can be improved.

Further, a capacitor element for holding a voltage between a gate and a source of the driving transistor 42 and the current controlling transistor 86 may be provided in the above configuration. This capacitor element holds video signals input in the pixel 13. Furthermore, when the video signals can be held in a parasitic capacitor or a gate capacitor, the capacitor element may not be provided.

[Embodiment 3]

Figure 13:
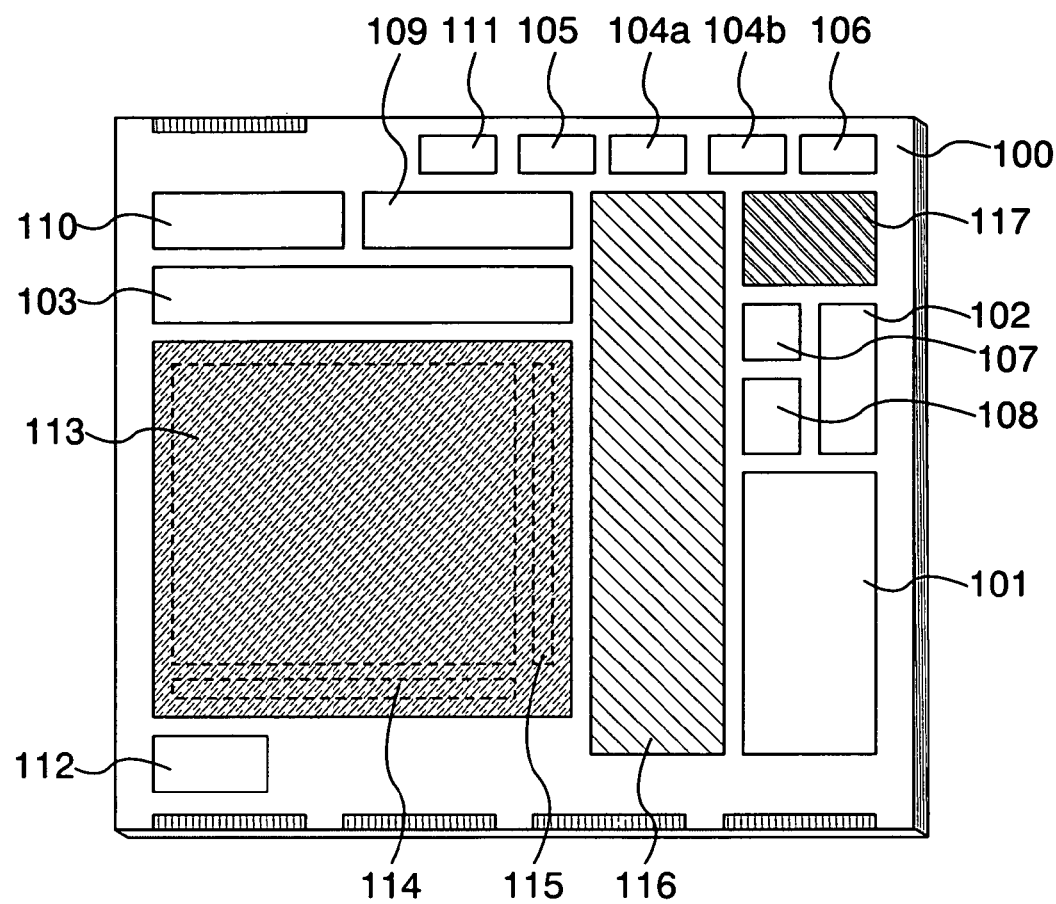
FIG. 13 is a diagram showing a display device according to the invention (Embodiment 3)

One embodiment of a display device of the present invention will be described with reference to FIG. 13. The display device comprises a data memory block, a display block, an image processing block, and a controlling block. All blocks are provided over a substrate 100. The data memory block comprises a memory circuit 101 for programming, a memory circuit 102 for a work area, a memory circuit 103 for audio data, memory circuits 104a and 104b for a line buffer, a memory circuit 105 for an in-range, a memory circuit 106 for a color palette, a memory controller 107, a decoder/resistor 108, a controller 109, a DA inverter circuit for audio data and an operating amplifier circuit 110, a reference power generating circuit 111 of a memory, and a gray scale power source 112. The display block comprises a pixel portion 113 and driver circuit portions 114 and 115. The image processing block comprises an image processing circuit 116. The controlling block comprises a CPU (central processing unit) 117.

As mentioned above, the display device having the data memory block, the image processing block and the controlling block besides the display block can be reduced in number of ICs to be connected. As a result, a small, thin and lightweight display device can be realized. Also, in this display device of the invention where the display block, the image processing block and the controlling block are adjacent to one another, these blocks are arranged in accordance with the flow of data, which allows to carry out the operation, precisely.

One feature of the invention is that memory circuits including memory elements each of which has a structure in that an organic compound layer is sandwiched between a pair of conductive layers are used as the memory circuits 101 to 106, respectively. Since the above mentioned structure of the memory elements is similar to a structure of a light emitting element, and therefore, these memory elements can be manufactured without increasing the number of manufacturing steps. In addition, since the structure of the memory elements is simple, they can be manufactured easily, and hence, an inexpensive display device can be provided. Also, since an area of a memory cell can be reduced easily, memory cells can be highly integrated, thereby providing a display device having a high-capacity memory circuit. Furthermore, another feature of the display device of the invention is that a plurality of pixels for displaying images and the memory circuits are provided over a same substrate. According to this feature, the number of IC chips connected to an external portion can be reduced, making it possible to provide a small, thin, and lightweight display device. The present embodiment can be freely combined with the above embodiment modes.

[Embodiment 4]

Figure 14:
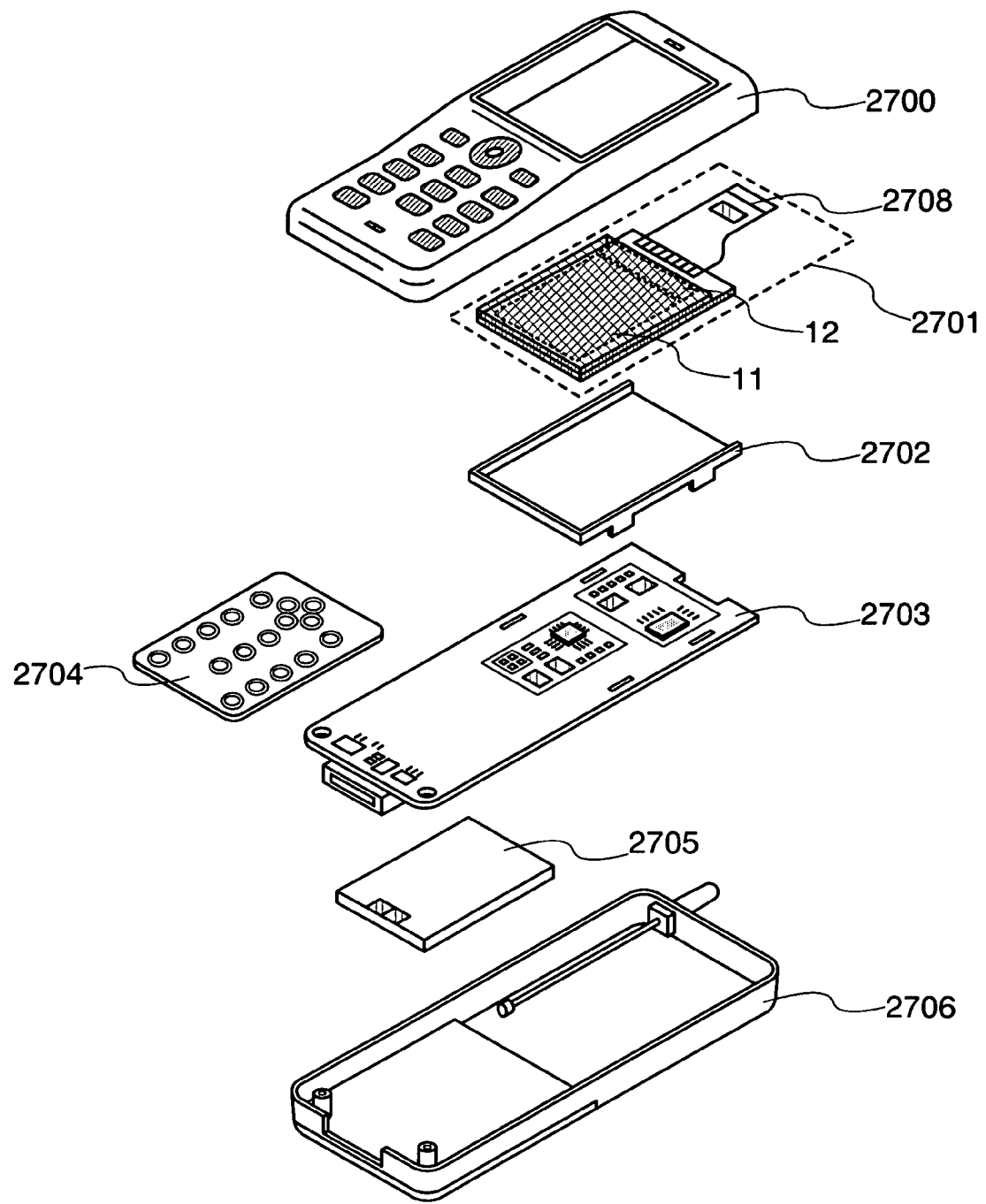
FIG. 14 is a diagram showing an electronic appliance that uses a display device of the invention (Embodiment 4)

Examples of electronic appliances using display devices according to the present invention will be described with reference to FIG. 14 and FIGS. 15A to 15F. FIG. 14 shows a cellular phone handset, including casings 2700 and 2706, a panel 2701, a housing 2702, a printed wiring board 2703, operation buttons 2704, and a battery 2705. The panel 2701 comprises a pixel portion 11 and a memory cell portion 12. The panel 2701 is built in the housing 2702 and is detachable freely. The housing 2702 is firmly attached to the printed wiring board 2703. The shape and the size of the housing 2702 are arbitrarily changed in accordance with an electronic appliance to which the panel 2701 is built in. A plurality of semiconductor devices (also referred to as IC chips) that are packaged are mounted over the printed wiring board 2703. The plurality of semiconductor devices mounted over the printed wiring board 2703 have any functions of a controller, a central processing unit (CPU), a memory, a power supply circuit, an image processing circuit, an audio processing circuit, a transmitting/receiving circuit, a time detection circuit, a correction circuit, a temperature detection circuit, and the like.

The panel 2701 is combined with the printed wiring board 2703 while sandwiching a connection film 2708 therebetween. The panel 2701, the housing 2702, and the printed wiring board 2703 are housed inside of the casings 2700 and 2706 along with the operation buttons 2704 and the buttery 2705. The pixel portion 11 included in the panel 2701 is arranged such that the pixel portion 11 can be recognized by sight through an opening window of the casings 2700.

Further, the casings 2700 and 2706 are shown as an example of an appearance of the cellular phone handset. An electronic appliance according to this embodiment can be changed in various modes in accordance with its performance and an intended purpose. Therefore, examples of electronic appliances will be described below referring to FIGS. 15A to 15F.

Figure 15A:
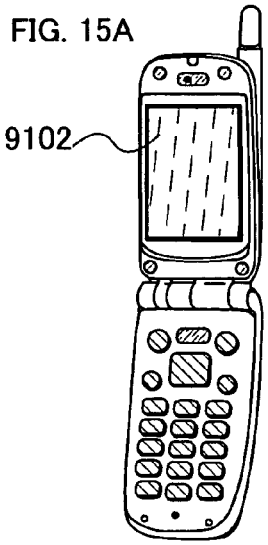
FIGS. 15A to 15F are diagrams showing electronic appliances using a display devices of the invention (Embodiment 4)

A cellular phone as shown in FIG. 15A comprises a pixel portion 9102 and the like. According to the present invention in that the pixel portion 9102 and a memory circuit are provided over a substrate, a small, thin and lightweight cellular phone that has high performance, multifunction, and high added value can be provided. To carry the cellular phone, the cellular phone has a small casing, and therefore, limitation in a space inside of the casing is caused. However, the display device of the present invention having the pixel portion 9102 and the memory circuit is small and thin, though the display device has the multifunction. Consequently, the display device is preferably used to form a cellular phone.

Figure 15B:
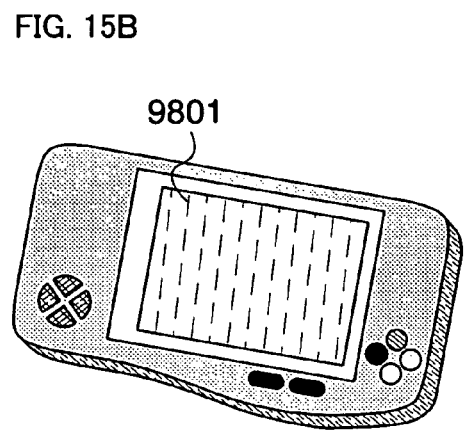

A portable game machine as shown in FIG. 15B comprises a pixel portion 9801 and the like. According to the present invention in that the pixel portion 9801 and a memory circuit are provided over a substrate, a small, thin and lightweight portable game machine that has high performance, multifunction, and high added value can be provided. To carry the portable game machine, the portable game machine has a small casing, and therefore, limitation in a space inside of the casing is caused. However, the display device of the present invention having the pixel portion 9801 and the memory circuit is small and thin, though the display device has the multifunction. Consequently, the display device is preferably used to form a portable gate machine.

Figure 15C:
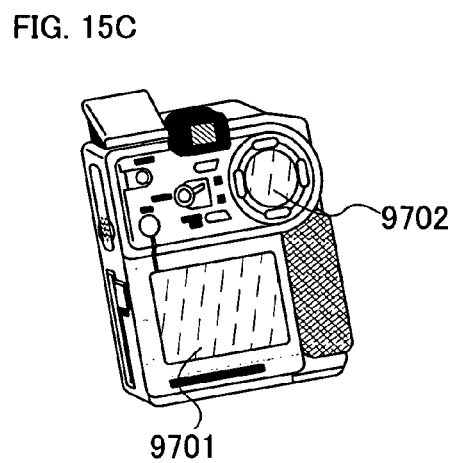

A digital camera as shown in FIG. 15C comprises pixel portions 9701 and 9702, and the like. According to the present invention in that the pixel portions 9701 and 9702 and memory circuits are provided over substrates, a small, thin and lightweight digital camera that has high performance, multifunction, and high added value can be provided. To carry the digital camera, the digital camera has a small casing, and therefore, limitation in a space inside of the casing is caused. However, the display devices of the present invention having the pixel portions 2701 and 2702 and the memory circuits are small and thin, respectively, though the display devices have the multifunction. Consequently, the display devices are preferably used to form a digital camera.

Figure 15D:
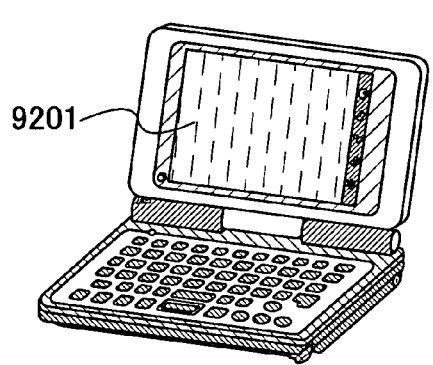

A portable information terminal as shown in FIG. 15D comprises a pixel portion 9201 and the like. According to the present invention in that the pixel portion 9201 and a memory circuit are provided over a substrate, a small, thin and lightweight portable information terminal that has high performance, multifunction, and high added value can be provided. To carry the portable information terminal, the portable information terminal has a small casing, and therefore, limitation in a space inside of the casing is caused. However, the display device of the present invention having the pixel portion 9201 and the memory circuit is small and thin, though the display device has the multifunction. Consequently, the display device is preferably used to form a portable information terminal.

Figure 15E:
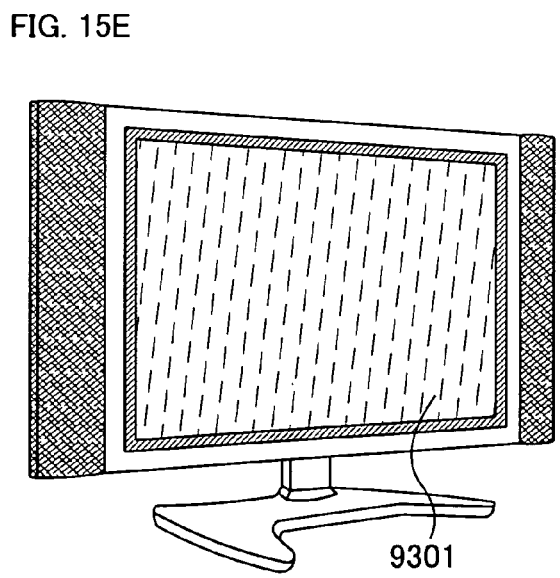

A television device as shown in FIG. 15E comprises a pixel portion 9301 and the like. According to the present invention in that the pixel portion 9301 and a memory circuit are provided over a substrate, a small, thin and lightweight television device that has high performance, multifunction, and high added value can be provided.

Figure 15F:
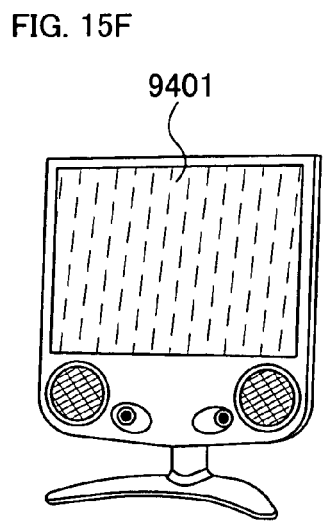

A monitor device as shown in FIG. 15F comprises a pixel portion 9401 and the like. According to the present invention in that the pixel portion 9401 and a memory circuit are provided over a substrate, a small, thin and lightweight monitor device that has high performance, multifunction, and high added value can be provided.

As set forth above, the present invention can be applied to various kinds of electronic appliances such as a television device (also referred to as a television or a television receiver), a digital camera, a portable information terminal such as a cellular phone (also referred to as a cellular phone handset or a cell phone) and a PDA, a portable game machine, a monitor device (also referred to as a monitor) for a computer, an audio reproducing device such as a car audio, and a domestic game machine. The present embodiment can be freely combined with the above embodiment modes and embodiments.

[Embodiment 5]

The present embodiment will describe results of experiments, wherein a memory element was formed over a substrate, and current-voltage characteristics were measured when writing data in the memory element by utilizing an electric effect. The memory element was formed by sequentially laminating a first conductive layer, a first organic compound layer, a second organic compound layer, and a second conductive layer. The first conductive layer was formed of a compound of silicon oxide and indium tin oxide. The first organic compound layer was formed of N,N'-bis (3-methylphenyl)-N,N'-diphenyl benzine (abbreviation: TPD). The second organic compound layer was formed of 4,4'-bis(N-[1-naphthyl]-N-phenyl-amino)-biphenyl (abbreviation: α-NPD). The second conductive layer was formed of aluminum. Further, the first organic compound layer was formed with a thickness of 10 nm, while the second organic compound layer was formed with a thickness of 50 nm.

Figure 16:
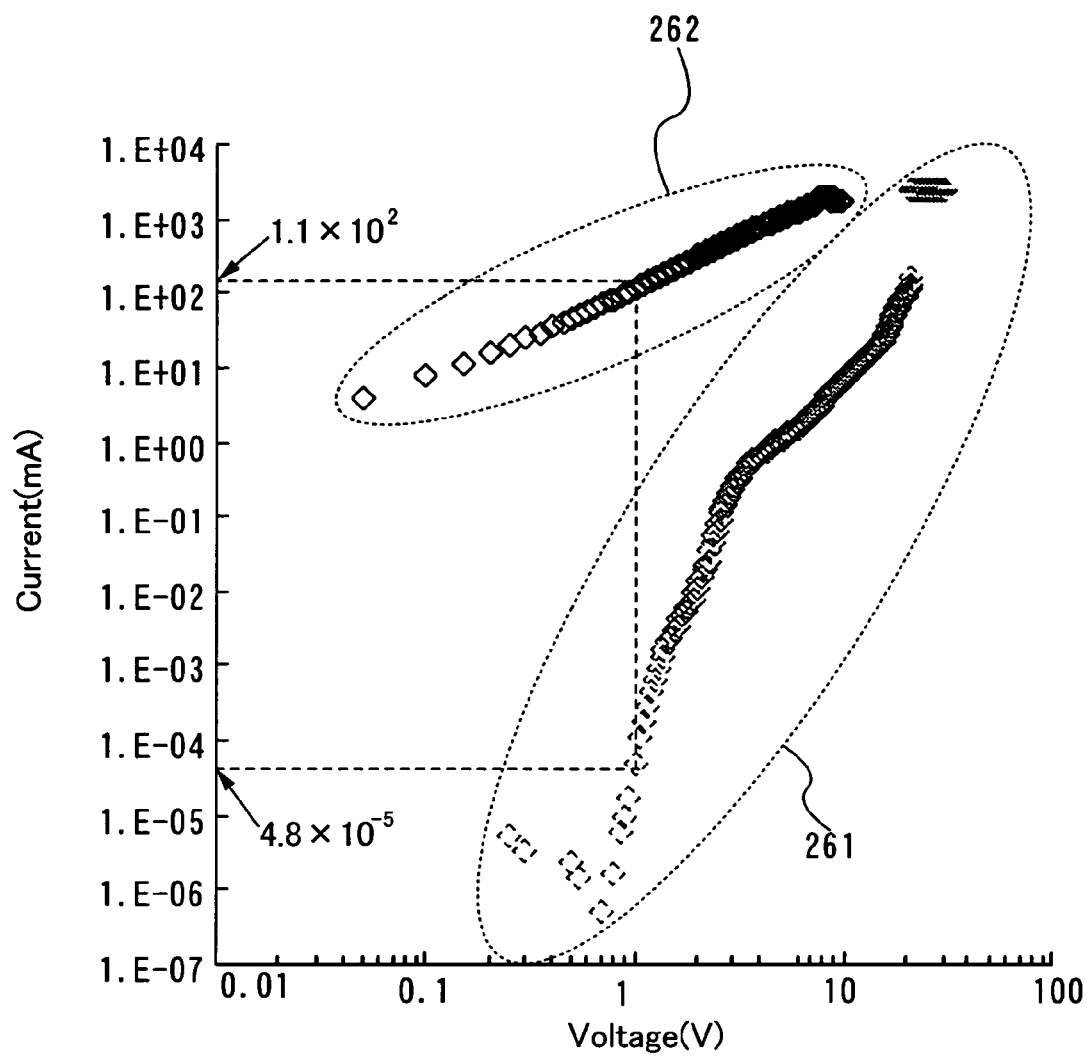
FIG. 16 is a graph showing current-voltage characteristics of a memory element (Embodiment 5)

Measurement results of current-voltage characteristics of the memory element before and after writing data in the memory element by utilizing an electric effect will be described referring to FIG. 16. In FIG. 16, a horizontal axis indicates the amount of voltage and a longitudinal axis indicates the amount of current. A plot 261 shows current-voltage characteristics of the memory element before writing data in the memory element by utilizing the electric effect. A plot 262 shows current-voltage characteristics of the memory element after writing the data in the memory element by the electric effect. According to FIG. 16, the current-voltage characteristics are significantly different between before and after writing the data in the memory element. For example, in the case where the applied voltage is 1V, the amount of current before wiring the data in the memory element is $4.8 \times 10^{-5}$ mA whereas the amount of current after writing the data in the memory element is $1.1 \times 10^2$ mA. Accordingly, the amount of current is increased $10^7$-fold after writing the data in the memory element. The resistance of the memory element is changed before and after writing the data in the memory element. As a result, by reading out the change in resistance of the memory element according to the amount of voltage or the amount of current, the memory element can function as a memory circuit.

When using the above mentioned memory element as the memory circuit, the desired amount of voltage (the amount of voltage which does not cause short-circuiting) is applied to the memory element every time the data is read out, and the resistance of the memory element is read out. Accordingly, the memory element is necessary to have current-voltage characteristics that are not varied even when the read-out operation is performed repeatedly, or, the desired amount of voltage is applied to the memory element repeatedly. Therefore, measurement results of current-voltage characteristics of memory elements after reading out data from the memory elements will be described with reference to FIG. 17. Further, in this experiment, the current-voltage characteristics of the memory elements were measured every time the data was read out from the memory element. The data read-out operation was performed five times in total so that the measurement of the current-voltage characteristics of the memory elements was performed five times in total. Further, this measurement of the current-voltage characteristics were carried out using a memory element of which the resistance was changed by writing data in the memory element by utilizing an electric effect and another memory element of which the resistance was not changed.

Figure 17:
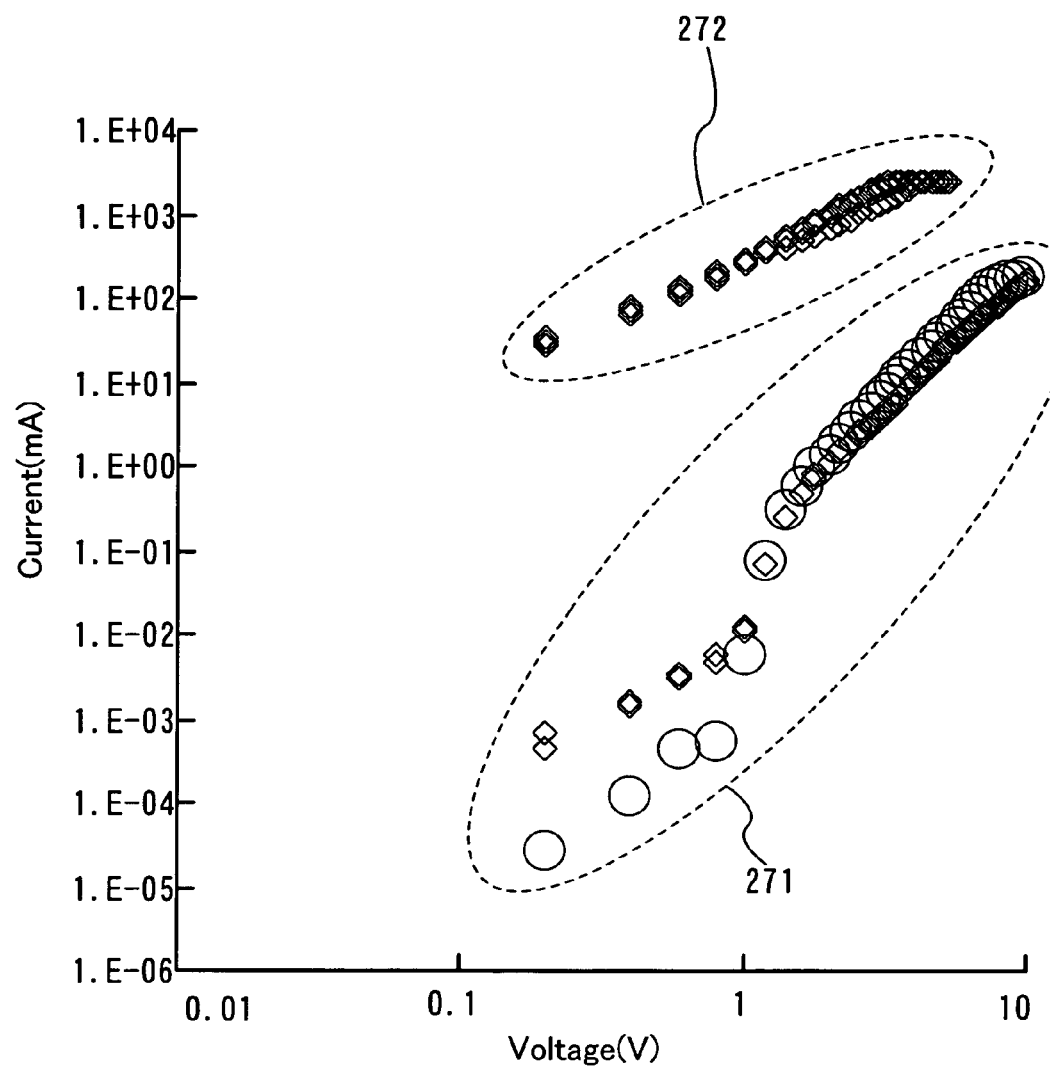
FIG. 17 is a graph showing current-voltage characteristics of a memory element (Embodiment 5)

In FIG. 17, a horizontal axis indicates the amount of voltage while a longitudinal axis indicates the amount of current. A plot 271 represents current-voltage characteristics of the memory element of which the resistance was changed by writing data in the memory element due to the electric effect. A plot 272 represents current-voltage characteristics of the other memory element of which the resistance was not changed. According to the plot 271, the current-voltage characteristics of the memory element of which the resistance was not changed exhibit favorable reproducibility at 1

V or more. Similarly, according to the plot 272, the current-voltage characteristics of the memory element of which the resistance was changed exhibit favorable reproducibility at 1V or more. As a result of the above measurement results, the current-voltage characteristics are not largely varied when the data read-out operation is performed plural times, repeatedly, thereby obtaining good reproducibility. Accordingly, the above mentioned memory elements can be used as memory circuits.

[Embodiment 6]

The present embodiment will describe measurement results of current-voltage characteristics, wherein a memory element is formed over a substrate and data is written in the memory element by utilizing an electric effect, with reference to FIGS. 18A and 18B, FIGS. 19A and 19B, and FIGS. 20A and 20B. In FIGS. 18A and 18B, FIGS. 19A and 19B, and FIGS. 20A and 20B, horizontal axes indicate the amount of voltage (V) and longitudinal axes indicate the amount of current density (mA/cm$^2$). Further, in FIGS. 18A and 18B, FIGS. 19A and 19B, and FIGS. 20A and 20B, a plot marked by open circles indicates measurement results of current-voltage characteristics of a memory element before writing data in the memory element, whereas a plot marked by open squares indicates measurement results of current-voltage characteristics of the memory element after writing data in the memory element. Further, the operation of writing data in the memory element by utilizing an electric effect corresponds to an operation by which a voltage is applied to the memory element to be short-circuited.

Six pieces of samples (samples 1 to 6) were used in the measurement of the voltage-current characteristics. The size of the six samples on a level surface is 2 mm×2 mm. Laminated structures of the six samples will be described below.

Figure 18A:
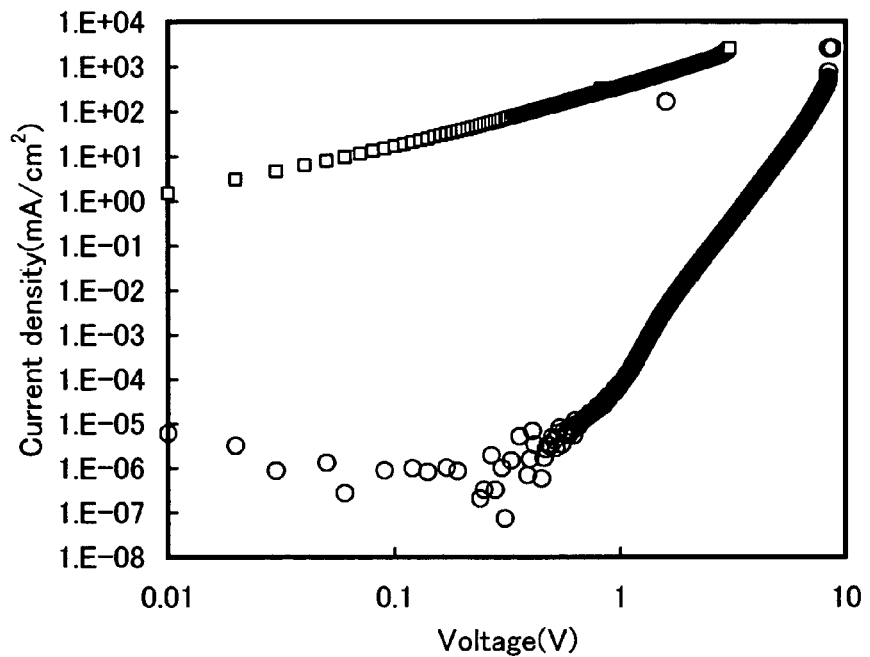
FIGS. 18A and 18B are graphs showing current-voltage characteristics of a memory element (Embodiment 6)

The sample 1 is an element formed by sequentially laminating a first conductive layer, an organic compound layer, and a second conductive layer. In the sample 1, the first conductive layer was formed of ITO containing silicon oxide, the organic compound layer was formed of TPD, and the second conductive layer was formed of aluminum. The organic compound layer was formed to have a thickness of 50 nm. Measurement results of current-voltage characteristics of the sample 1 are shown in FIG. 18A.

Figure 18B:
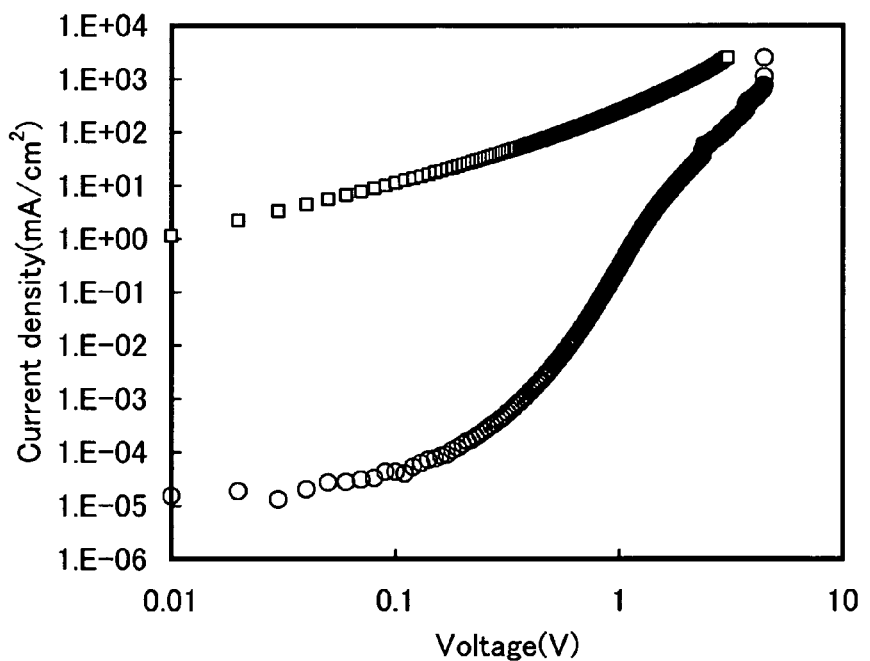

The sample 2 is an element formed by sequentially laminating a first conductive layer, an organic compound layer, and a second conductive layer. In the sample 2, the fist conductive layer was formed of ITO containing silicon oxide, the organic compound layer was formed of TPD doped with 2,3,5,6-tetrafluoro-7,7,8,8-tetracyanoquinodimethane (abbreviation: F4-TCNQ), and the second conductive layer was formed of aluminum. The organic compound layer was formed with a thickness of 50 nm using TPD doped with 0.01 wt % of F4-TCNQ. Measurement results of current-voltage characteristics of the sample 2 are shown in FIG. 18B.

Figure 19A:
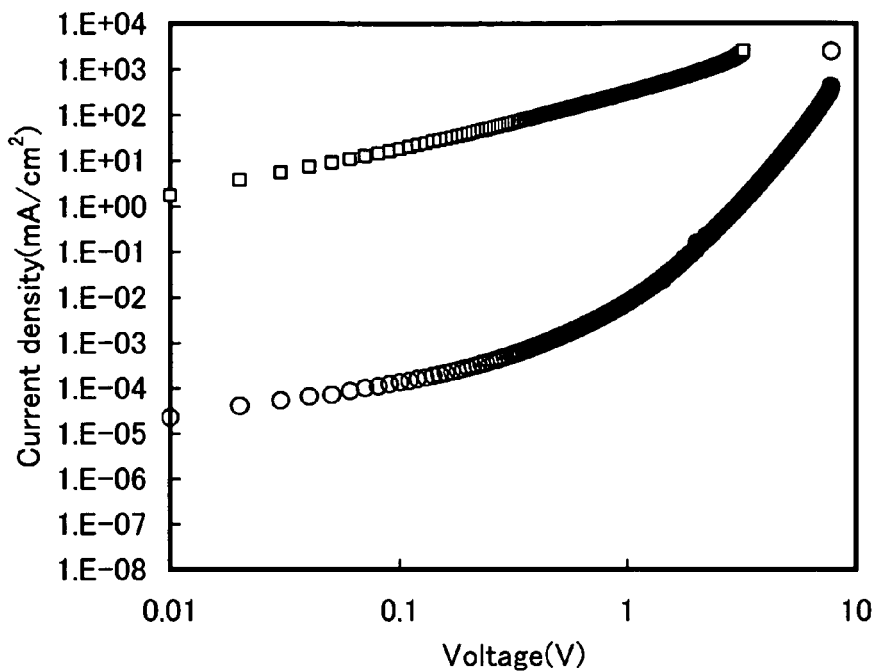
FIGS. 19A and 19B are graphs showing current-voltage characteristics of a memory element (Embodiment 6)

The sample 3 is an element formed by sequentially laminating a first conductive layer, a first organic compound layer, a second organic compound layer, and a second conductive layer. In the sample 3, the first conductive layer was formed of ITO containing silicon oxide, the first organic compound layer was formed of TPD, the second organic compound layer was formed of F4-TCNQ, and the second conductive layer was formed of aluminum. Further, the thickness of the first organic compound layer was set to be 50 nm and the thickness of the second organic compound layer was set to be 1 nm. Measurement results of current-voltage characteristics of the sample 3 are shown in FIG. 19A.

Figure 19B:
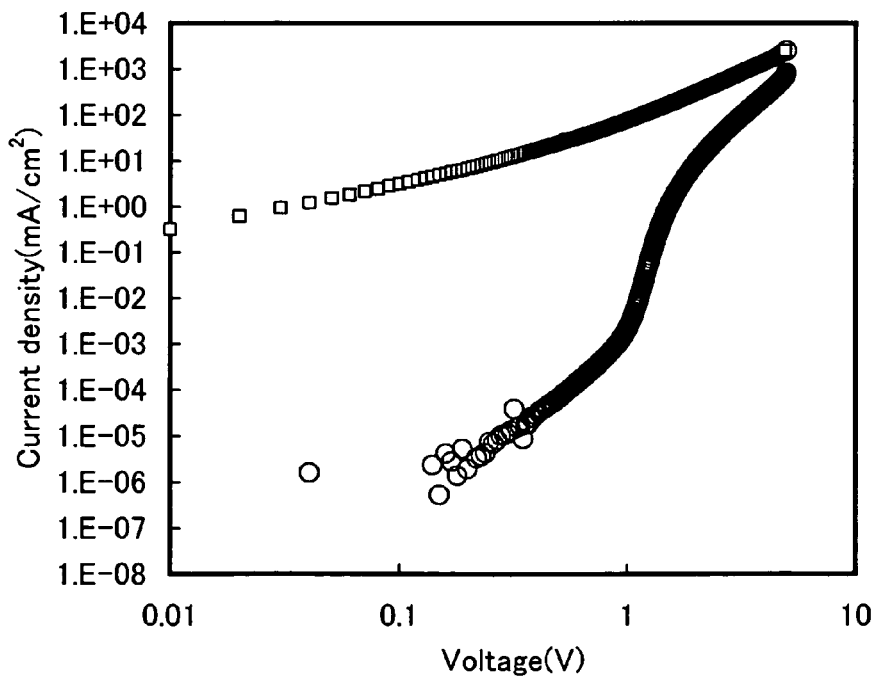

The sample 4 is an element formed by sequentially laminating a first conductive layer, a first organic compound layer, a second organic compound layer, and a second conductive layer. In the sample 4, the first conductive layer was formed of ITO containing silicon oxide, the first organic compound layer was formed of F4-TCNQ, the second organic compound layer was formed of TPD, and the second conductive layer was formed of aluminum. Further, the thickness of the first organic compound layer was set to be 1 nm and the thickness of the second organic compound layer was set to be 50 nm. Measurement results of current-voltage characteristics of the sample 4 are shown in FIG. 19B.

Figure 20A:
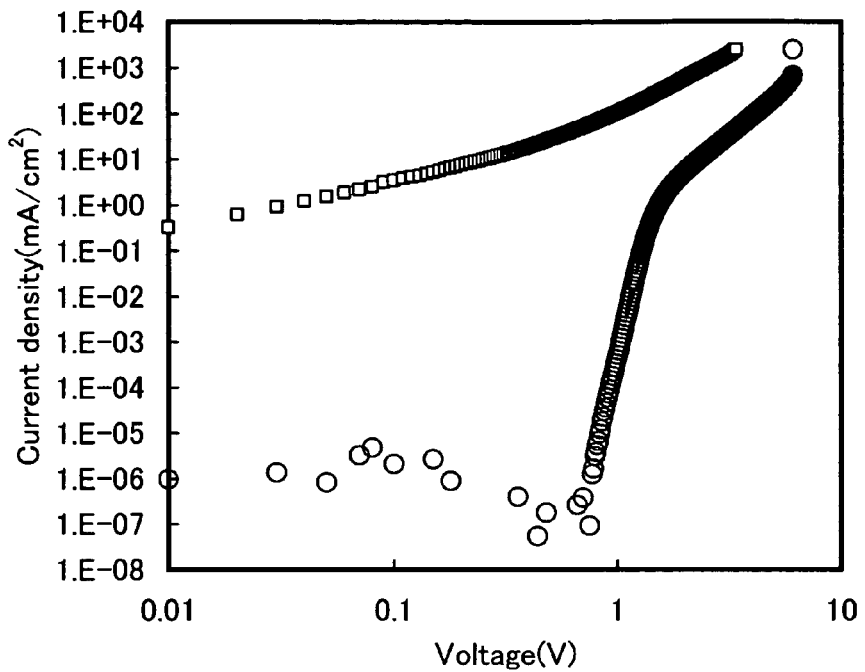
FIGS. 20A and 20B are graphs showing current-voltage characteristics of a memory element.

The sample 5 is an element formed by sequentially laminating a first conductive layer, a first organic compound layer, a second organic compound layer, and a second conductive layer. In the sample 5, the first conductive layer was formed of ITO containing silicon oxide, the first organic compound layer was formed of TPD doped with F4-TCNQ, the second organic compound layer was formed of TPD, and the second conductive layer was formed of aluminum. Further, the first organic compound layer was formed with a thickness of 40 nm using TPD doped with 0.01 wt % of F4-TCNQ. Also, the thickness of the second organic compound layer was set to be 40 nm. Measurement results of current-voltage characteristics of the sample 5 are shown in FIG. 20A.

Figure 20B:
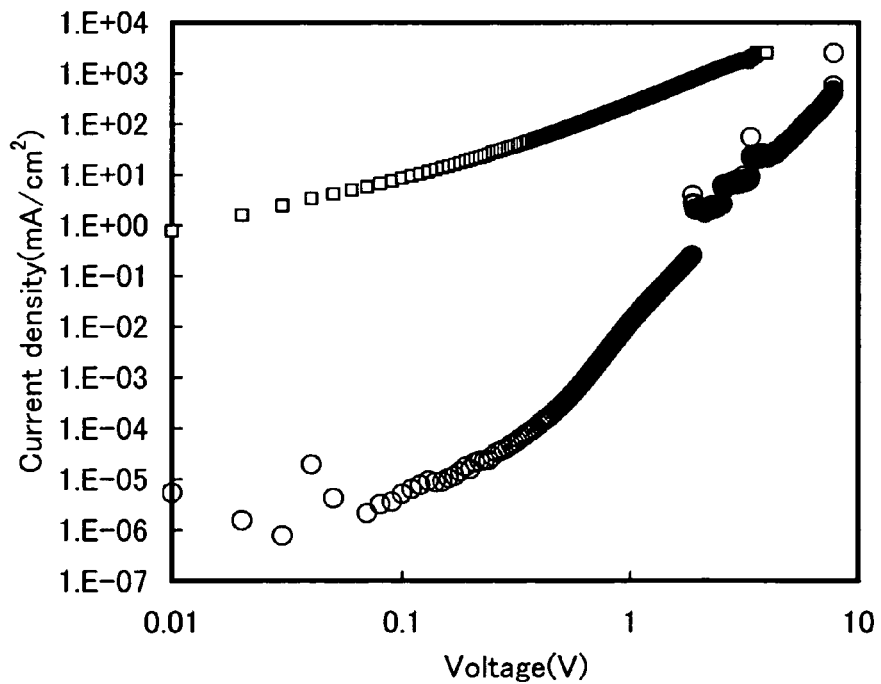

The sample 6 is an element formed by sequentially laminating a first conductive layer, a first organic compound layer, a second organic compound layer, and a second conductive layer. In the sample 6, the first conductive layer was formed of ITO containing silicon oxide, the first organic compound layer was formed of TPD, the second organic compound layer was formed of TPD doped with F4-TCNQ, and the second conductive layer was formed of aluminum. Further, the first organic compound layer was formed with a thickness of 40 nm. The second organic compound layer was formed with a thickness of 10 nm using TPD doped with 0.01 wt % of F4-TCNQ. Measurement results of current-voltage characteristics of the sample 6 are shown in FIG. 20B.

According to the measurement results as shown in FIGS. 18A and 18B, FIGS. 19A and 19B and FIGS. 20A and 20B, it is seen that there is a significant difference in the current-voltage characteristics of the respective memory elements before writing data in the memory elements (before the short-circuiting of the memory elements) and after writing data in the memory elements (after the short-circuiting of the memory elements).

A write-in voltage (V) of the sample 1 was 8.4. A write-in voltage (V) of the sample 2 was 4.4. A write-in voltage (V) of the sample 3 was 3.2. A write-in voltage (V) of the sample 4 was 5.0. A write-in voltage of the sample 5 was 6.1. A write-in voltage (V) of the sample 6 was 7.8. The write-in voltages of the samples 1 to 6 had repeatabilities and the difference in the write-in voltage of each sample was within 0.1 V.

Next, changes in current density before and after writing data in the samples 1 to 6 will be described. The value R1 showing change in current density is obtained by dividing the current density A of one memory element applied with 1 V after writing data in the memory element into the current density B of the memory element applied with 1 V before writing data in the memory element (i.e., R1=A÷B). The value R2 showing change in current density is obtained by dividing the current density C of one memory element applied with 3V after writing data in the memory element into the current density D of the memory element applied with 3V before writing data in the memory element (i.e., R2=C÷D).

The R1 of the sample 1 was $1.9 \times 10^7$ and R2 was $8.4 \times 10^3$. The R1 of the sample 2 was $8.0 \times 10^8$ and the R2 was $2.1 \times 10^2$. The R3 of the sample 3 was $8.7 \times 10^4$ and the R2 was $2.0 \times 10^2$. The R1 of the sample 4 was $3.7 \times 10^4$ and the R2 was $1.0 \times 10^1$. The R1 of the sample 5 was $2.0 \times 10^5$ and the R2 was $5.9 \times 10^1$. The R1 of the sample 6 was $2.0 \times 10^4$ and the R2 was $2.5 \times 10^2$. According to these results, it is known that the magnitude of changes in the amount of current when applying 1 V to the respective memory elements is $10^3$ times or more larger than the magnitude of changes in the amount of current when applying 3 V to the respective memory elements.

What is claimed is:

1. A display device comprising:
   a plurality of pixels for displaying an image provided over a substrate; and
   a plurality of memory cells for storing data provided over the substrate,
   wherein each of the plurality of pixels has a light emitting element,
   wherein each of the plurality of memory cells has a memory element,
   wherein the light emitting element comprises a first conductive layer, a first organic compound layer over and in contact with the first conductive layer, and a second conductive layer over and in contact with the first organic compound layer,
   wherein the memory element comprises a third conductive layer, a second organic compound layer over and in contact with the third conductive layer, and a fourth conductive layer over and in contact with the second organic compound layer, and
   wherein the first organic compound layer and the second organic compound layer are formed from a same material and formed in a same plane.

2. The display device according to claim 1, wherein a conducting property of the memory element is changed by an optical effect.

3. The display device according to claim 1, wherein a resistance of the memory element is changed by an optical effect.

4. The display device according to claim 1, wherein a resistance of the memory element is changed by an electric effect.

5. The display device according to claim 1, wherein a distance between the third conductive layer and the fourth conductive layer is changed by an electric effect.

6. The display device according to claim 1, wherein the second organic compound layer is made from a conjugated polymer material doped with a photo acid generator.

7. An electronic appliance using the display device as disclosed in claim 1.

8. The display device according to claim 1, further comprising a driver circuit portion including a transistor,
   wherein the driver circuit portion is provided between the plurality of pixels and the plurality of memory cells.

9. A display device comprising:
   a pixel portion for displaying an image provided over a substrate, and
   a memory cell portion for storing data provided over the substrate,
   wherein the pixel portion has a plurality of pixels,
   wherein the memory cell portion has a plurality of memory cells,
   wherein each of the plurality of pixels has a light emitting element and a first transistor,
   wherein each of the plurality of memory cells has a memory element and a second transistor,
   wherein the light emitting element comprises a first conductive layer, a first organic compound layer over and in contact with the first conductive layer, and a second conductive layer over and in contact with the first organic compound layer,
   wherein the memory element comprises a third conductive layer, a second organic compound layer over and in contact with the third conductive layer, and a fourth conductive layer over and in contact with the second organic compound layer,
   wherein the first conductive layer is connected to a source region or a drain region of the first transistor,
   wherein the third conductive layer is connected to a source region or a drain region of the second transistor, and
   wherein the first organic compound layer and the second organic compound layer are formed from a same material and formed in a same plane.

10. The display device according to claim 9, wherein a conducting property of the memory element is changed by an optical effect.

11. The display device according to claim 9, wherein a resistance of the memory element is changed by an optical effect.

12. The display device according to claim 9, wherein a resistance of the memory element is changed by an electric effect.

13. The display device according to claim 9, wherein a distance between the third conductive layer and the fourth conductive layer is changed by an electric effect.

14. The display device according to claim 9, wherein the second organic compound layer is made from a conjugated polymer material doped with a photo acid generator.

15. An electronic appliance using the display device as disclosed in claim 9.

16. The display device according to claim 9, further comprising a driver circuit portion including a third transistor,
   wherein the driver circuit portion is provided between the plurality of pixels and the plurality of memory cells.

* * * * *